United States Patent [19]
Zook

[11] Patent Number: 5,991,911
[45] Date of Patent: Nov. 23, 1999

[54] CONCURRENT GENERATION OF ECC ERROR SYNDROMES AND CRC VALIDATION SYNDROMES IN A DVD STORAGE DEVICE

[75] Inventor: Christopher P. Zook, Longmont, Colo.

[73] Assignee: Cirrus Logic, Inc., Fremont, Calif.

[21] Appl. No.: 08/970,600

[22] Filed: Nov. 14, 1997

[51] Int. Cl.$^6$ ................................................. G11B 20/18
[52] U.S. Cl. ......................... 714/758; 714/755; 714/769
[58] Field of Search .................................. 714/758, 769, 714/755

[56] References Cited

U.S. PATENT DOCUMENTS

| | | | |
|---|---|---|---|
| 5,027,357 | 6/1991 | Yu et al. | 371/37.7 |
| 5,408,477 | 4/1995 | Okada et al. | 371/37.4 |
| 5,412,667 | 5/1995 | Havemose | 371/37.5 |
| 5,446,743 | 8/1995 | Zook | 371/37.1 |
| 5,563,897 | 10/1996 | Pyniah et al. | 371/37.4 |
| 5,592,498 | 1/1997 | Zook | 371/40.1 |
| 5,602,857 | 2/1997 | Zook et al. | 371/40.1 |
| 5,701,304 | 12/1997 | Glover et al. | 371/10.2 |
| 5,751,733 | 5/1998 | Glover | 371/40.3 |
| 5,781,565 | 7/1998 | Sako et al. | 371/37.4 |

OTHER PUBLICATIONS

U.S. application No. 08/898,774, Zook, filed Jul. 23, 1997.

*Primary Examiner*—Stephen M. Baker
*Attorney, Agent, or Firm*—Howard H. Sheerin; Dan A. Shifrin

[57] ABSTRACT

A compact disk (CD) and digital video disk (DVD) error correction system is disclosed which generates a CRC validation syndrome on-the-fly while correcting the CD/DVD product code, thereby reducing the overall access latency as compared to the prior art. For the DVD product code, which comprises multiple data sectors with separate CRC symbols appended to each data sector, a buffer used for C1 and C2 encoding/decoding in CD mode is used to store partial data and error CRC syndromes for each data sector. During the vertical (P) and horizontal (Q) passes over the DVD product code, data and error CRC syndrome registers are loaded with the appropriate partial CRC syndromes depending on the current data symbol being processed by a P/Q decoder. After processing each data sector, the data and error CRC syndromes for each data sector are combined and compared to a constant to determine whether the corrections to the data sector are valid and complete. The data and error CRC syndromes are adjusted during the P and Q passes to account for offsets in the CRC codeword symbols. For example, when processing a vertical (i.e., P) codeword, it is necessary to adjust the error CRC syndromes by one row of data symbols for each vertical symbol processed. This is carried out by using a special multiplier circuit which multiplies the data and error CRC syndromes by $$x^k \text{MOD} G(x)$$

where k is the offset (e.g., one row of symbols) and G(x) is the CRC generator polynomial.

18 Claims, 24 Drawing Sheets

CONCURRENT GENERATION OF ECC ERROR SYNDROMES AND CRC VALIDATION SYNDROMES IN A DVD STORAGE DEVICE

CROSS REFERENCE TO RELATED APPLICATIONS AND PATENTS

This application is related to concurrently filed U.S. patent application Ser. No. 08/970,918 entitled "AN ECC SYSTEM FOR GENERATING A CRC SYNDROME OVER RANDOMIZED DATA IN A COMPUTER STORAGE DEVICE," and concurrently filed U.S. patent application Ser. No. 08/970,730 entitled "AN ECC SYSTEM EMPLOYING A DATA BUFFER FOR STORING CODEWORD DATA AND A SYNDROME BUFFER FOR STORING ERROR SYNDROMES," and U.S. Pat. No. 5,446,743 entitled "COEFFICIENT UPDATING METHOD AND APPARATUS FOR REED-SOLOMON DECODER." The above-referenced U.S. patent applications and U.S. patents are incorporated herein by reference.

FIELD OF INVENTION

The present invention relates to error correcting systems for computer storage devices, particularly to generating CRC validation syndromes concurrent with generating ECC error syndromes of a Reed-Solomon code during the vertical and horiztonal passes over a DVD product code.

BACKGROUND OF THE INVENTION

In computer storage devices (such as magnetic and optical disk drives) the bandwidth of the recording channel is limited, as well is the signal power. To achieve performance gains, various coding techniques are employed to increase the effective signal-to-noise ratio (SNR) by increasing the system's immunity to noise. This allows an increase in storage capacity by increasing the recording density while maintaining an arbitrarily low bit error rate.

There are generally two types of codes currently employed in recording devices: channel codes and error correction codes (ECC). Channel codes are directed at noise caused by a particular characteristic of the recording channel. For instance, a run-length limited (RLL) code is a channel code designed to attenuate noise due to intersymbol interference by limiting the minimum spacing between the pulses that represent the data symbols in the analog carrier signal. The spectral content of the data to be recorded may also adversely affect the system's ability to accurately detect the data upon readback; consequently, some data sequences may be harder to detect than others. To compensate for this phenomenon, a channel code for randomizing the data is commonly employed in recording devices which effectively "whitens" the data by randomizing it before writing the data to the disk storage medium. Upon read back, the recording channel is able to detect the randomized data at a lower bit error rate than if the data is not randomized. The data read from the storage medium is derandomized before being transferred to the host.

In error correction coding (ECC), the binary data to be recorded are processed mathematically to generate redundancy symbols that are appended to the data to form codewords which are written to the disk storage medium. Upon readback, the recorded codewords are estimated (detected) from the read signal, and the redundancy symbols are used to decode the estimated codewords back into the originally recorded user data. The redundancy symbols provide, in effect, a buffer which shields the codeword from noise as it passes through the recording channel. When enough noise "penetrates" this buffer, it mutates a written codeword into a different received codeword, thereby resulting in an error when decoded into the user data.

The more redundancy symbols employed in an error correction code, the larger the buffer around the codeword and the more noise that can be tolerated before a decoding error occurs. However, there is an upper bound on the performance of any given recording channel known as the "channel capacity" which refers to the maximum user data transmission rate (or recording density) achievable for a given channel while maintaining an arbitrarily low bit error rate. Ultimately, the channel capacity is a function of the channel bandwidth and the signal to noise (SNR) ratio. As mentioned above, channel codes and error correction codes are a means for improving performance by increasing the effective SNR.

There are many approaches to encoding/decoding the user data in order to maximize the reliability and efficiency of a recording channel; ultimately, the goal is to design a system that approaches the channel capacity while minimizing the implementation complexity and cost. Block error correcting codes are commonly employed in disk storage systems, particularly the Reed-Solomon block code due to its excellent error correction properties and low implementation cost and complexity.

Block codes encode a k-symbol input block of the source data stream into an n-symbol output block or codeword where n-k is the number of redundancy symbols and k/n is referred to as the code rate. The codewords are then transmitted through (stored to) the communication medium and decoded by the receiver. The encoding process performs a mathematical operation over the input block such that the output codewords are different from one another by a parameter referred to as the minimum distance of the code $d_{min}$. The minimum distance $d_{min}$ between codewords determines the amount of noise that the system can tolerate before a received codeword is decoded erroneously.

With Reed-Solomon codes, the data stream is processed as a sequence of symbols, where the symbols are typically selected from a finite field $GF(2^w)$. The parameter w denotes the number of binary data bits per symbol. Each symbol of the k-symbol input block represents the coefficients of a data polynomial D(x). The redundancy symbols (which are also represented as a polynomial W(x)) are then computed as the modulo division of the input data polynomial D(x) divided by a generator polynomial G(x):

$$W(x) = (x^m \cdot D(x)) \bmod G(x)$$

where m is the degree of the generator polynomial which equals the number of redundancy symbols. The redundancy polynomial W(x) is then added to the data polynomial D(x) to generate a codeword polynomial C(x):

$$C(x) = (x^m \cdot D(x)) + W(x).$$

Those skilled in the art understand that the encoder circuitry for performing the above operations can be implemented with minimum cost using a linear feedback shift register (LFSR).

After encoding, the codeword C(x) is transmitted through the noisy communication channel, wherein the received codeword C'(x) equals the transmitted codeword C(x) plus an error polynomial E(x). The received codeword C'(x) is corrected according to the following steps: (1) compute error syndromes $S_i$; (2) compute the coefficients of an error locator polynomial using the error syndromes $S_i$; (3) compute the roots of the error locator polynomial, the logs of the roots are the error locations $L_i$; and (4) compute the error values using the error syndromes $S_i$ and the roots of the error locator polynomial.

The error syndromes $S_i$ are computed as the modulo division of the received codeword polynomial C'(x) divided by the factors of the generator polynomial G(x):

$$S_i = C'(x) \text{MOD}(x + \alpha^i)$$

when $$G(x) = \prod_{i=0}^{m-1} (x + \alpha^i)$$

where $\alpha$ is a primitive element of the finite field $GF(2^w)$ Techniques for performing the other steps of the decoding process, computing the error locator polynomial, computing the roots of the error locator polynomial, and computing the error values, are well known by those skilled in the art and are not necessary to understand the present invention. See, for example, the above referenced U.S. Pat. No. 5,446,743 entitled "COEFFICIENT UPDATING METHOD AND APPARATUS FOR REED-SOLOMON DECODER."

Another technique known in the prior art to further increase the error tolerance is to arrange the codewords into what is known as a multi-dimensional or product code. Digital Video Disk (DVD) storage systems, for example, commonly employ a two-dimensional product code shown in FIG. 3A. The codewords are arranged into intersecting horizontal (row or Q) and vertical (column or P) codewords and the decoding process is carried out in iterative passes. First a pass over the horizontal codewords is performed to correct as many errors as possible; any uncorrectable horizontal codewords are left unmodified. Then a pass is made over the vertical codewords to correct as many errors as possible, where a symbol corrected in a vertical codeword also corrects the corresponding symbol for the intersecting horizontal codeword. Consequently, the horizontal codeword may be correctable during the next horizontal pass. Similarly, a symbol corrected during a horizontal pass may render a previously uncorrectable vertical codeword correctable during the next vertical pass. This iterative process continues until the entire product code is corrected, or deemed uncorrectable.

The two-dimensional product code of FIG. 3A also comprises CRC redundancy symbols which are used to check the validity of the corrections to the row and column codewords. The CRC redundancy is typically generated by processing the user data according to $$\text{CRC redundancy} = P(x) \cdot x^{n-k} \bmod G(x)$$

where P(x) is the user data represented as a polynomial having coefficients in a finite field $GF(2^m)$, n-k is the number of CRC redundancy symbols, and G(x) is a generator polynomial. The CRC redundancy is then appended to the user data before the resulting code word C(x) is written to the disk. During a read operation, the data read from the disk are processed to generate a CRC syndrome $S_{CRC}$ according to $$S_{CRC} = C'(x) \bmod G(x),$$

where C'(x) is the received code word polynomial (including the CRC redundancy) read from the disk. If the codeword C'(x) is error-free, then the syndrome $S_{CRC}$ will be zero.

The CRC redundancy are typically generated over the data during a write operation before encoding the ECC redundancy symbols, and the CRC syndrome is generated during a read operation after the ECC redundancy are used to correct the product code. In this manner, the CRC syndrome operates to validate the corrections and to detect miscorrections. This is an extremely important function because it prevents the error correction system from passing "bad data" to the host system.

An overview of a prior art error correction system typically found in a CD/DVD optical disk storage system is shown in FIG. 1. During a write operation (assuming the device is not read only) user data received from a host system are stored in a data buffer 1. A CRC generator-and-correction validator 2 then reads the user data from the buffer over line 3, generates the CRC redundancy symbols, and restores the user data with appended redundancy symbols back into the data buffer 1. Thereafter the data is again read from the data buffer 1 (including the CRC redundancy), randomized by a data randomizer 4, and the randomized data restored to the data buffer 1. A P/Q encoder/decoder 5 then reads the randomized data from the data buffer 1, and an ECC/syndrome generator 12 generates the ECC redundancy symbols for the P and Q codewords to form the two-dimensional product code shown in FIG. 3A. The individual P and Q codewords are restored to the data buffer 1 after appending the ECC redundancy symbols. Once the entire product code has been generated, it is read from the data buffer 1 and written to the optical storage medium 6.

If the system is configured for a compact disk (CD) data format, then additional redundancy, referred to as C1 and C2, are generated and appended to the data before writing it to the disk. Thus to facilitate the CD recording format, the error correction system comprises a C1 encoder/decoder 7, a C2 encoder/decoder 8, and an interleaver/deinterleaver 9 for implementing the well known Cross Interleave Reed-Solomon Code (CIRC). Typically a static RAM (SRAM) 10 is employed to implement the CIRC coding process; SRAM is much faster than dynamic RAM (DRAM), the latter being used to implement the data buffer 1.

During a read operation, the process is run in reverse. If configured for CD format, then the C1 and C2 decoders make preliminary corrections to the randomized data as it is read from the optical disk 6 and stored in the data buffer 1. Once a complete product code is available in the data buffer 1, the P/Q decoder 5 begins the iterative passes over the P and Q codewords to make further corrections. The ECC/syndrome generator generates ECC syndromes transmitted over line 13 to an error corrector 14. The error corrector uses the ECC syndromes to correct errors in the individual codewords as described above. If at the end of a P or Q pass all of the ECC error syndromes are zero, indicating that the product code is error free (unless miscorrected), then the randomized data is read from the data buffer 1 and derandomized by derandomizer 4. As the data is derandomized, it is processed by the CRC generator-and-correction validator 2 to generate the CRC syndrome. If the CRC syndrome is zero, indicating that the corrections to the P and Q codewords are valid and complete, then the data is again read from the data buffer 1, derandomized, and the derandomized data transferred to the host system. If the CRC syndrome is non-zero, indicating that the product code has been miscorrected, then the CRC generator-and-correction validator 2 sends an error message to the host system over line 11 wherein the host system will initiate a retry operation (i.e., attempt to reread the data from the disk).

A fundamental drawback of the prior art error correction system shown in FIG. 1 is that the data must be derandomized before performing the CRC validation step. This requires an additional buffer access to read the entire product code, derandomize the data, and generate the CRC syndrome as described above. Obviously this increases the latency of the storage system which is highly undesirable, especially for multi-media applications where large blocks of audio/video data must be read from the storage system in a continuous stream to achieve smooth, uninterrupted performance.

There is, therefore, a need for an error correction system in a computer storage device that avoids the latency associated with verifying the validity and completeness of corrections to a multi-dimensional code, such as a CD/DVD product code.

SUMMARY OF THE INVENTION

An error correction system for computer storage devices is disclosed which avoids the latency associated with verifying the validity and completeness of corrections to a multi-dimensional code. In the preferred embodiment, the validation is carried out using a cyclic redundancy check (CRC). During a write operation, CRC redundancy symbols are computed over user data received from a host system, and after appending the CRC symbols, the data is randomized by XORing it with a pseudo random data pattern. ECC symbols are then generated (preferably using a Reed-Solomon code) over the randomized data to form row (Q) and column (P) codewords of a product code; the product code is then written to the disk. Upon readback, the product code is stored in a data buffer for decoding by a P/Q decoder. During a first pass over the Q codewords, a data CRC syndrome is generated over the uncorrected randomized data; the data CRC syndrome is stored in a data CRC register. Also during the first pass and subsequent passes, when corrections are made to the P or Q codewords the correction values are applied to an error CRC register. After processing a complete CRC codeword, the data CRC and error CRC registers are combined to generate a final CRC syndrome. The final CRC syndrome is compared to a constant to determine if the corrections to the product code are valid and complete, where the constant equals the CRC over the random data pattern. In this manner, the CRC check can be performed over the randomized data, thereby avoiding the latency associated with accessing the data buffer to derandomize the data before generating the CRC syndrome.

Another advantage provided by the present invention is the ability to generate the CRC syndrome on-the-fly concurrent with correcting the P and Q codewords. Thus, after processing a CRC codeword, the CRC syndrome is available immediately for checking the validity and completeness of the corrections—it is not necessary to access the data buffer to generate the CRC syndrome.

An enabling aspect of the present invention is to adjust the data and error CRC syndromes during the P and Q passes to account for offsets in the CRC codeword symbols. For example, when processing a vertical (i.e., P) codeword, it is necessary to adjust the error CRC syndromes by one row of data symbols for each vertical symbol processed. This is carried out by using a special multiplier circuit which multiplies the data and error CRC syndromes by $x^k \text{MOD} G(x)$ where k is the offset (e.g., one row of symbols) and $G(x)$ is the CRC generator polynomial.

For the DVD product code, which comprises multiple data sectors with separate CRC symbols appended to each data sector, the SRAM used for the C1 and C2 encoding/decoding in CD mode is used to store partial data and error CRC syndromes for each data sector. During the P and Q passes, the data and error CRC syndrome registers are loaded with the appropriate partial CRC syndromes depending on the current data symbol being processed by the P/Q decoder. After processing each data sector, the data and error CRC syndromes for each data sector are combined and compared to a constant equal to the CRC over the pseudo random data pattern.

BRIEF DESCRIPTION OF THE DRAWINGS

The above and other aspects and advantages of the present invention will be better understood by reading the following detailed description of the invention in view of the drawings, wherein.

DETAILED DESCRIPTION OF THE PREFERRED EMBODIMENT

System Overview

Figure 1:
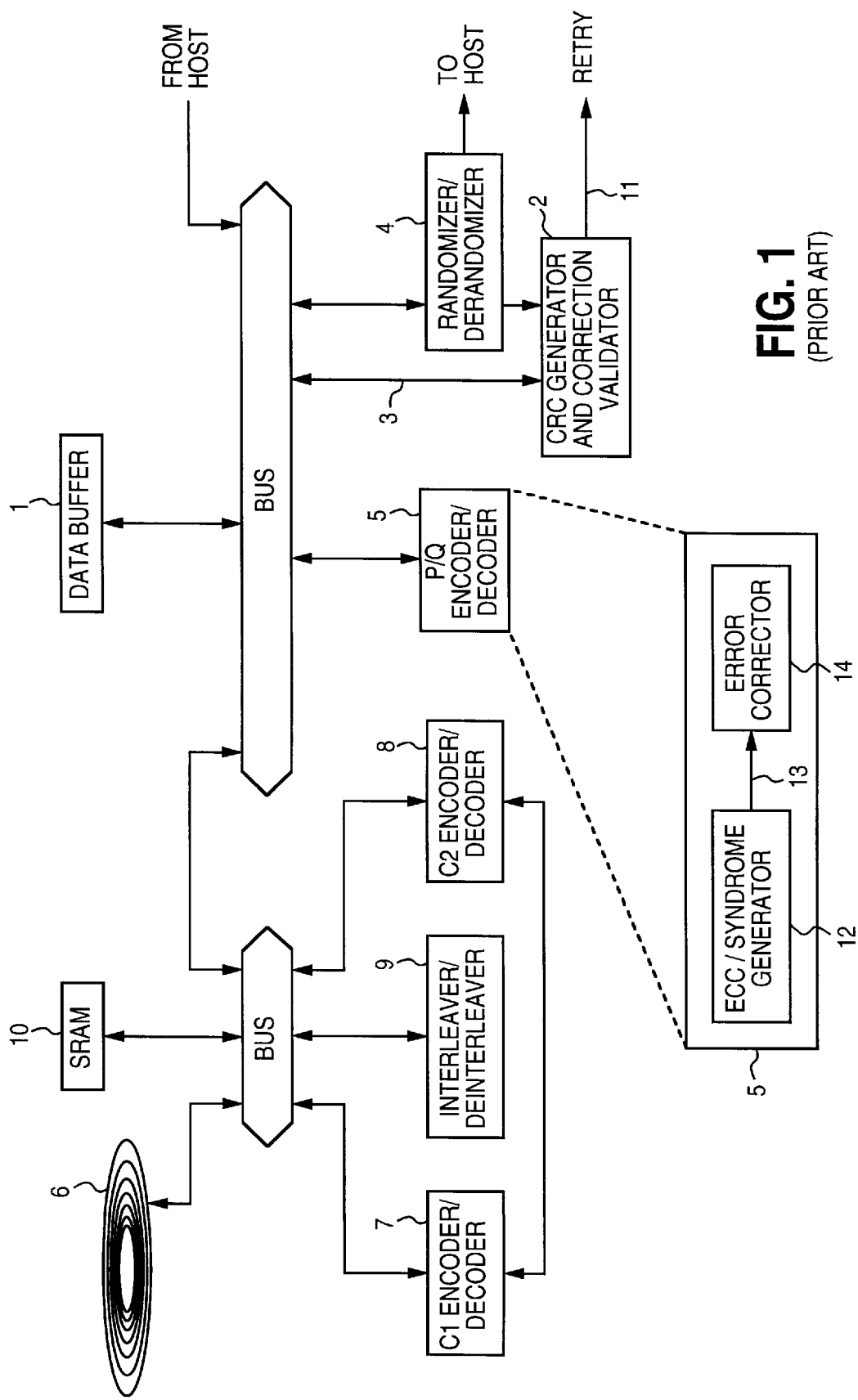
FIG. 1 is a block diagram of a prior art error correction system typically employed in a CD/DVD optical storage device.
Figure 2:
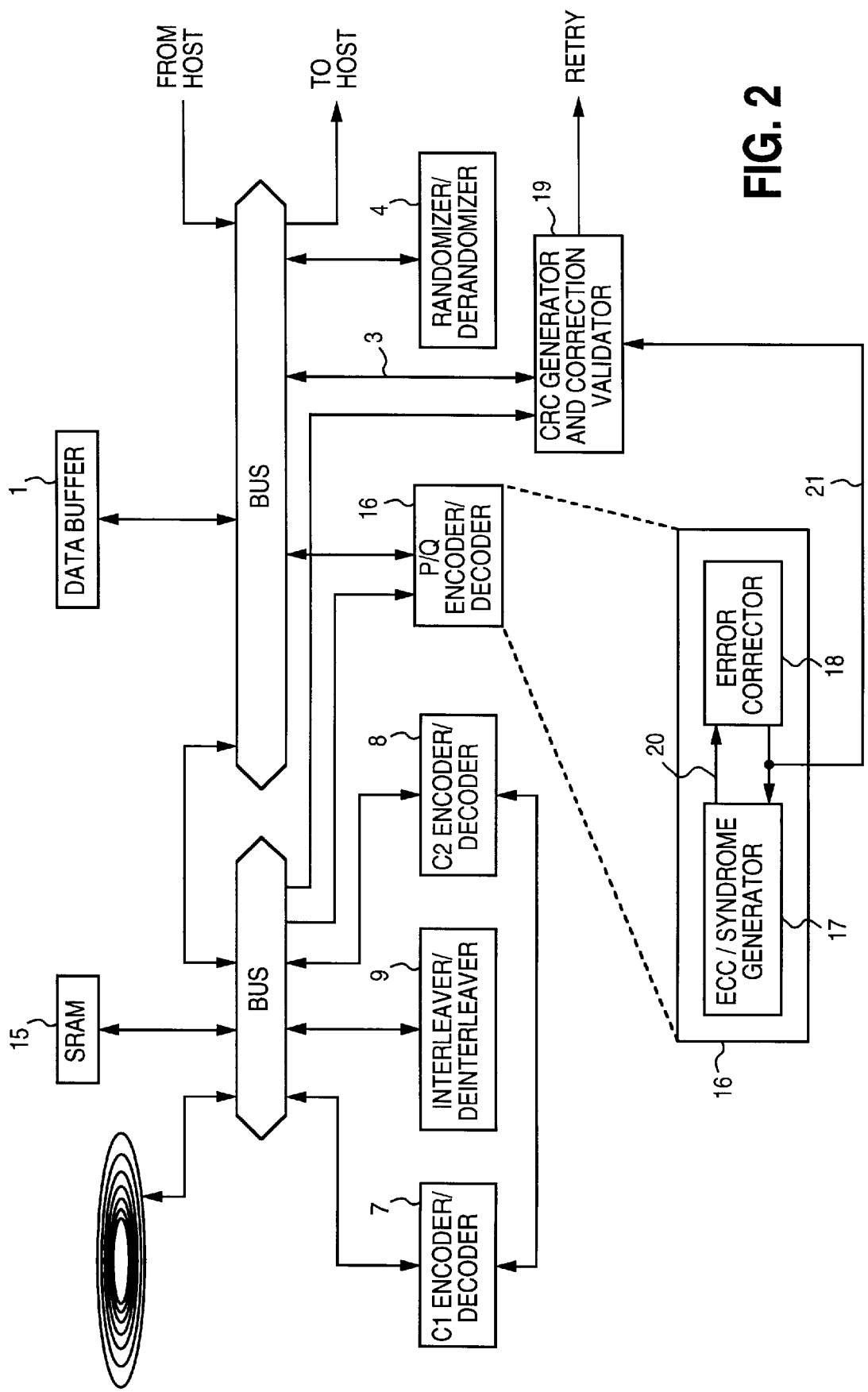
FIG. 2 is a block diagram of the error correction system of the present invention, including a CRC generator-and-correction validator for generating a CRC syndrome on-the-fly over the randomized data.

An overview of the error correction system of the present invention is shown in FIG. 2. The operation is similar to the prior art system described above with reference to FIG. 1, except for the following modifications. During a read operation, the ECC error syndromes are generated concurrently for both the horizontal and vertical codewords of the product code during the first horizontal pass. The ECC error syndromes are stored in an SRAM 15 which is also used for the CIRC error correction when decoding a CD product code. This significantly reduces the latency of the storage device since it obviates the need to access the data buffer 1 in order to regenerate the ECC error syndromes during subsequent horizontal or vertical passes. Another important modification of the present invention is to generate the CRC syndrome concurrently with correcting the product code, as well as to check the CRC syndrome before derandomizing the data stored in the data buffer. This reduces even further the latency of the storage system by obviating the need to read the entire product code from the data buffer 1 in order to generate the CRC syndrome.

The components that differ from the prior art error correction system of FIG. 1 are the SRAM 15, the P/Q decoder 16 (including the ECC/syndrome generator 17 and error corrector 18), and the CRC generator-and-correction validator 19. The ECC/syndrome generator 17 uses the SRAM 15 in generating and storing the ECC syndromes which are transferred to the error corrector over line 20. The correction values generated by the error corrector 18 for correcting the codewords stored in the data buffer 1 are also communicated over line 21 to the ECC/syndrome generator 17 for use in updating the ECC syndromes. The CRC generator-and-correction validator 19 also uses the SRAM 15 to store sixteen partial CRC syndromes for the sixteen data sectors of a DVD product code. The partial CRC syndromes stored in the SRAM 15 are updated using the correction values generated by the error corrector 18; the correction values are communicated over line 21 to the CRC generator-and-correction validator 19.

Data Format

Figure 3A:
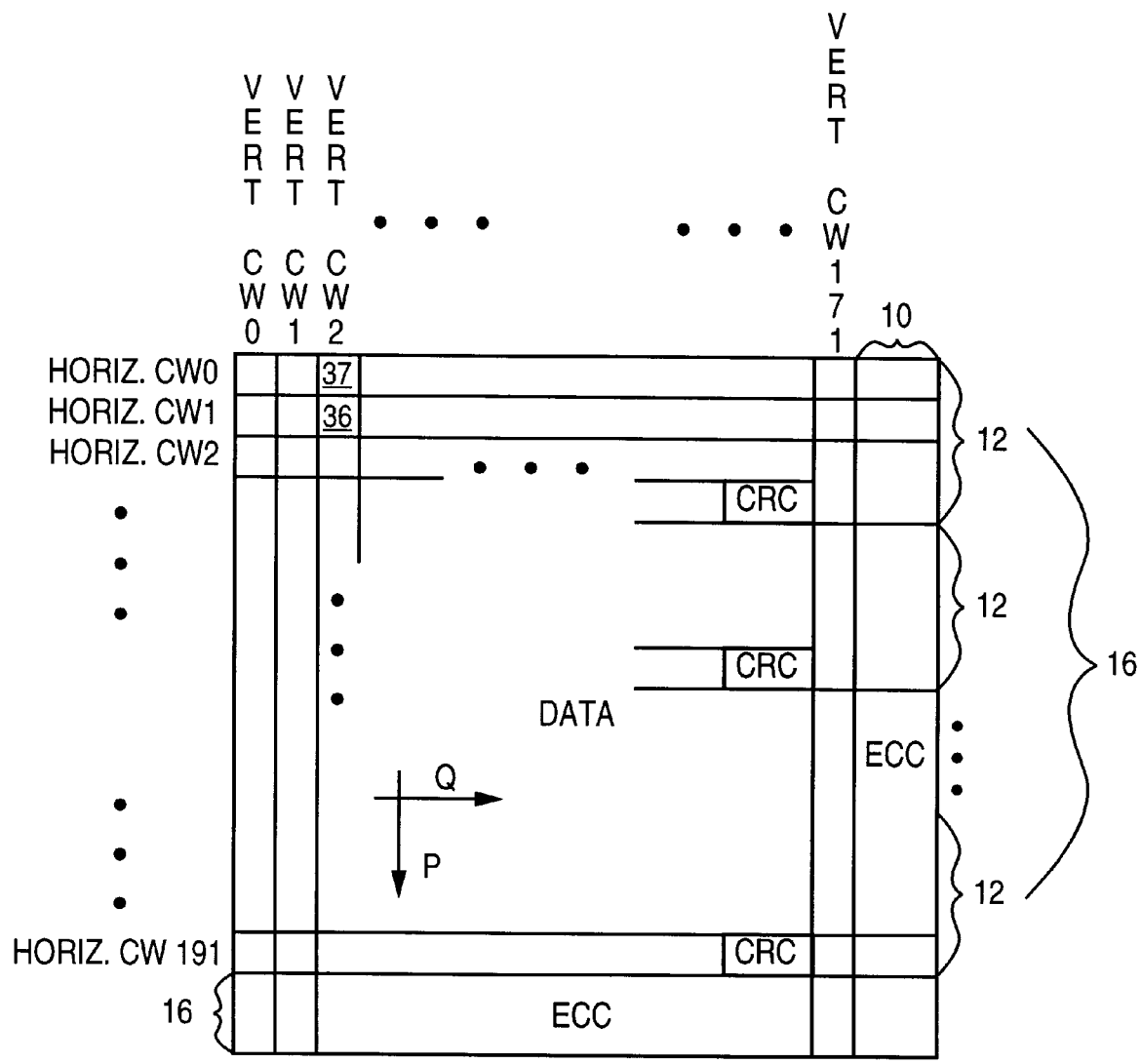
FIG. 3A shows the format of a product code typically employed in DVD optical storage devices comprising sixteen data sectors.

The data format of a two-dimensional product code typically employed in a DVD storage device is shown in FIG. 3A. The product code comprises 16 data sectors, where each data sector comprises 12 horizontal codewords (Q codewords). Each horizontal codeword comprises 10 ECC redundancy symbols preferably generated according to a Reed-Solomon code. There are 182 vertical codewords (P codewords) each comprising 16 redundancy symbols as shown. The ECC redundancy symbols also form ECC codewords; that is, the ECC redundancy symbols are correctable in the same manner as the user data. Thus, there is a total of 182 vertical codewords including the 10 vertical ECC codewords on the right side, and 208 horizontal codewords including 16 horizontal ECC codewords on the bottom.

At the end of each of the 126 data sectors are four CRC symbols for use in verifying the validity and completeness of the corrections to the codewords using the ECC redundancy symbols. As described above, during a write operation the CRC symbols are typically generated over the user data before the data is randomized and before adding the ECC redundancy symbols. Thus the CRC symbols do not cover the ECC symbols. Further, the prior art error correction systems must derandomize the data before performing the CRC check.

Figure 3B:
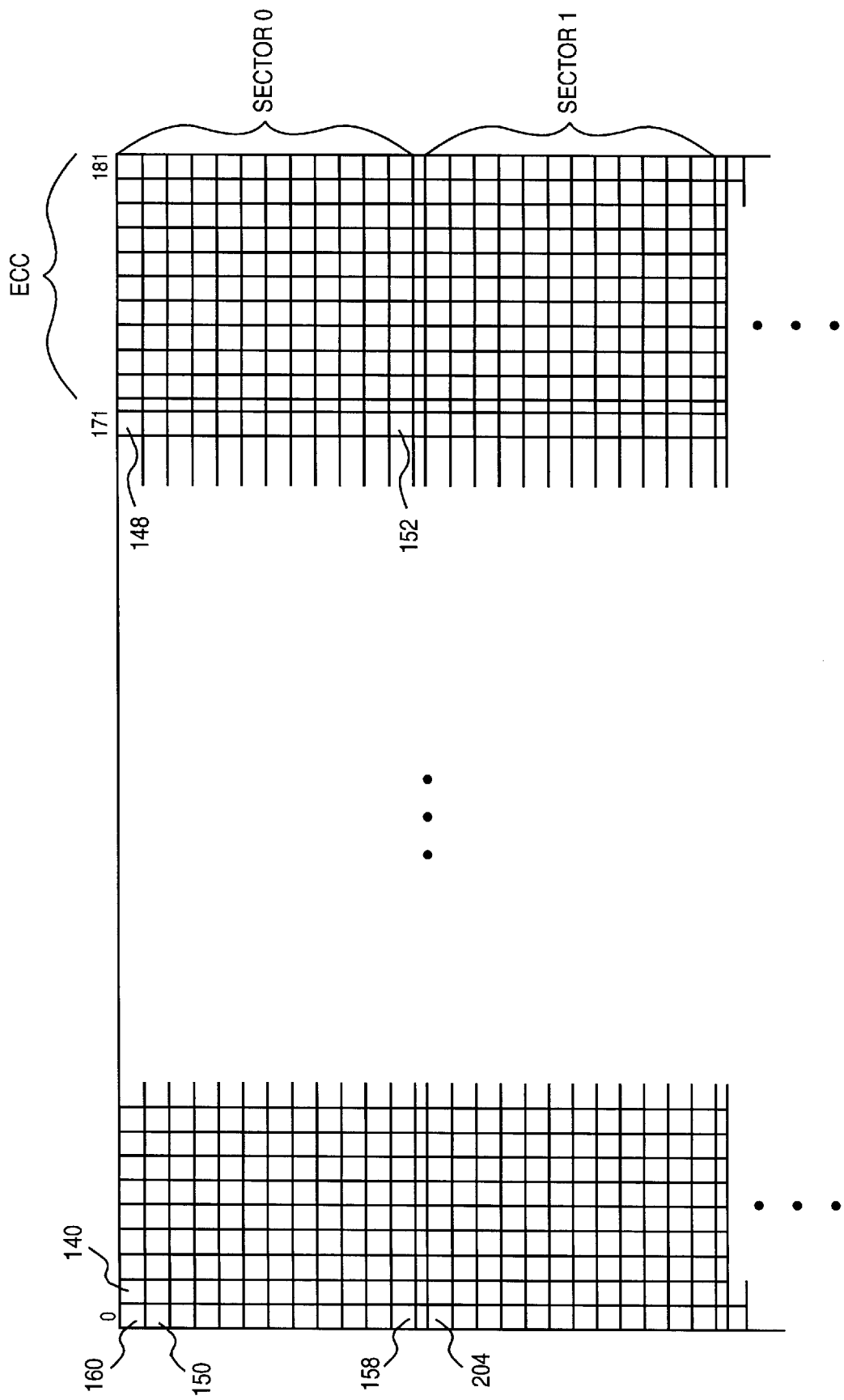
FIG. 3B shows the format of the first two data sectors of the product code of FIG. 3A.

FIG. 3B shows more details of the first two data sectors of the product code of FIG. 3A. The technique of the present invention for generating the CRC syndrome concurrently with correcting the ECC codewords is described below with reference to this figure.

Data Randomizer/Derandomizer

The error correction system of the present invention comprises a data randomizer/derandomizer 4 which "whitens" the user data to prevent difficult to detect data sequences from being recorded to the disk. As described above with reference to FIG. 2, the user data stored in the data buffer 1 are randomized after the CRC symbols are generated. The ECC/syndrome generator 12 then processes the randomized data to generate the ECC redundancy for the P and Q codewords of the product code shown in FIG. 3A. Upon readback, the product code is corrected, the corrections verified, and if the corrections are valid and complete, the data is derandomized and transferred to the host system.

Figure 3C:
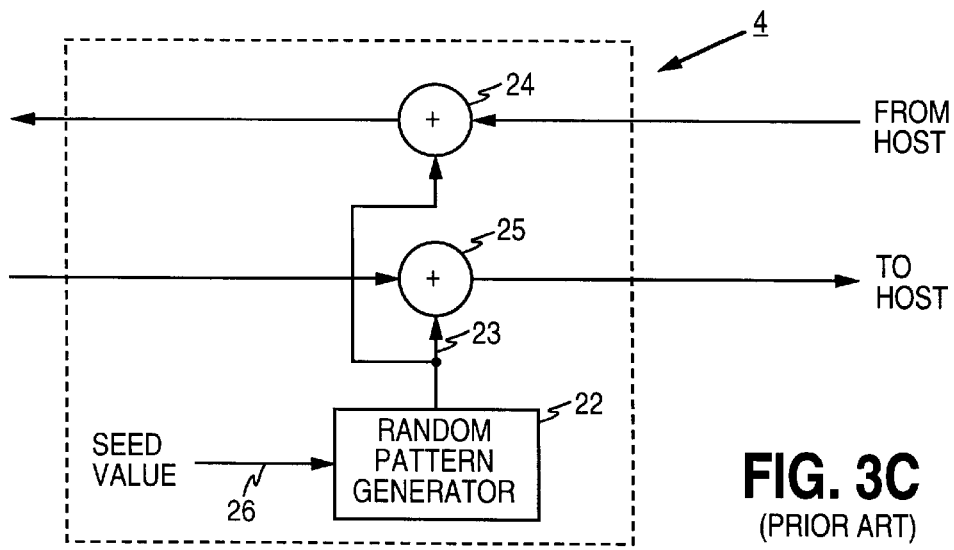
FIGS. 3C and 3D illustrate details of the data randomizer/derandomizer employed in the present invention.
Figure 3D:
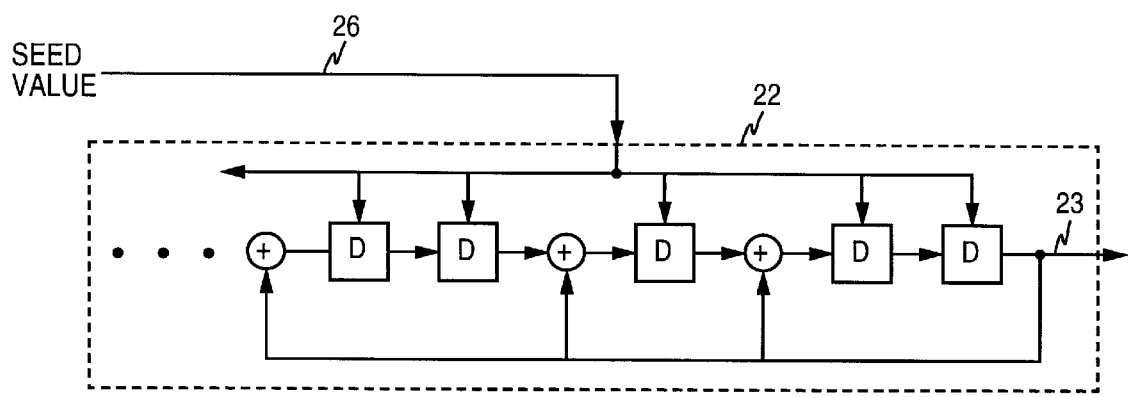

The circuitry for randomizing/derandomizing the data is well known by those skilled in the art and is shown in FIGS. 3C and 3D. The circuitry comprises a random pattern generator for generating a pseudo random data sequence applied to line 23. During a read operation, the user data and CRC symbols stored in the data buffer 1 are added (XORed) to the random data sequence at adder 24, thereby randomizing the data before it is written to the disk. Upon readback, the random pattern generator 22 generates the same pseudo random data sequence which is added (XORed) to the data read from the disk at adder 25, thereby derandomizing the data before transferring it to the host system.

Preferably, the pseudo random data sequence is generated using 8-bit symbols, the symbol size of the ECC code. The preferred embodiment for generating the pseudo random data sequence is to use a linear feedback shift register (LFSR) as shown in FIG. 3D. The LFSR circuits is initialized with a seed value over line 26; the pseudo random data sequence will be different depending on the seed value. A different seed value is used for each DVD product code shown in FIG. 3A.

Concurrent Horizontal and Vertical ECC Syndrome Generation

Disclosed below are the circuits and flow diagrams for concurrently generating the ECC and CRC syndromes and for updating the ECC and CRC syndromes using the correction values. There are two embodiments for the ECC syndrome generator 17 of the present invention. In a first embodiment, the ECC syndromes are generated for the vertical codewords concurrently with generating the syndromes for the horizontal codewords during a horizontal pass. As described in greater detail below, the SRAM 15 facilitates generating the vertical syndromes. In this manner, the ECC syndromes for the vertical codewords are available in the SRAM 15 immediately after the horizontal pass—the vertical codewords can be corrected without accessing the data buffer in order to generate the ECC syndromes, thereby significantly reducing the error correction latency. This embodiment is particularly well suited to product codes that employ a large amount of ECC redundancy, such as in DVD storage devices, where the corrections will usually be complete after a single pass over the horizontal and vertical codewords.

In a second embodiment of the ECC syndrome generator 17, which is directed at product codes employing less ECC redundancy and thus require multiple horizontal and vertical passes, the SRAM 15 stores the ECC syndromes for both the horizontal and vertical codewords. Both sets of ECC syndromes are generated concurrently during the first horizontal pass, and the ECC syndromes are updated using the corrections values. In this manner, the latency in accessing the data buffer to regenerate the ECC syndromes is avoided for both the horizontal and vertical passes. The error correction is performed in a fraction of the time because passes subsequent to the first pass need only access the data buffer to make corrections to the data.

Figure 4:
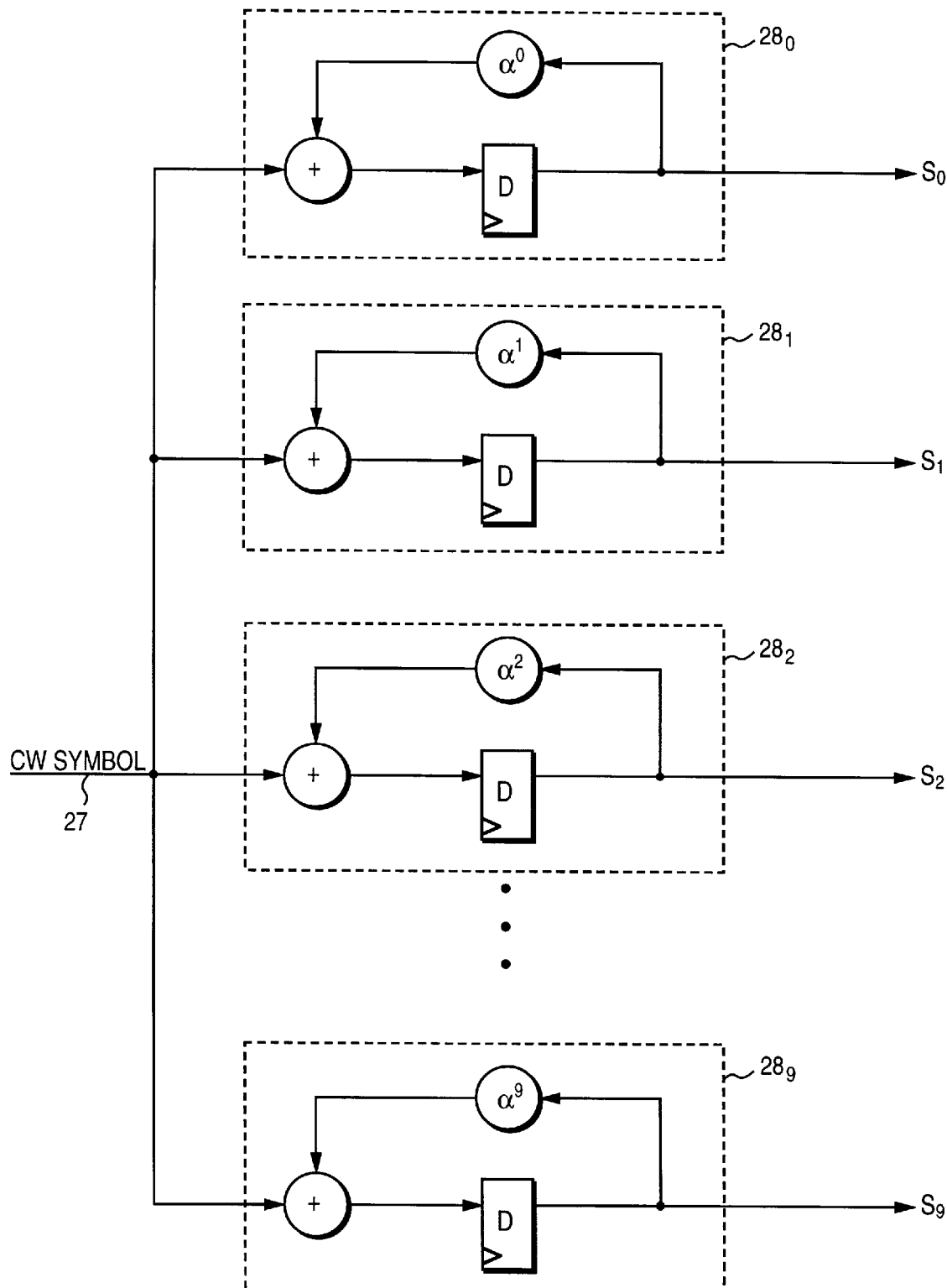
FIG. 4 shows detailed circuitry for generating the horizontal codeword error syndromes according to a first embodiment of the present invention.
Figure 5:
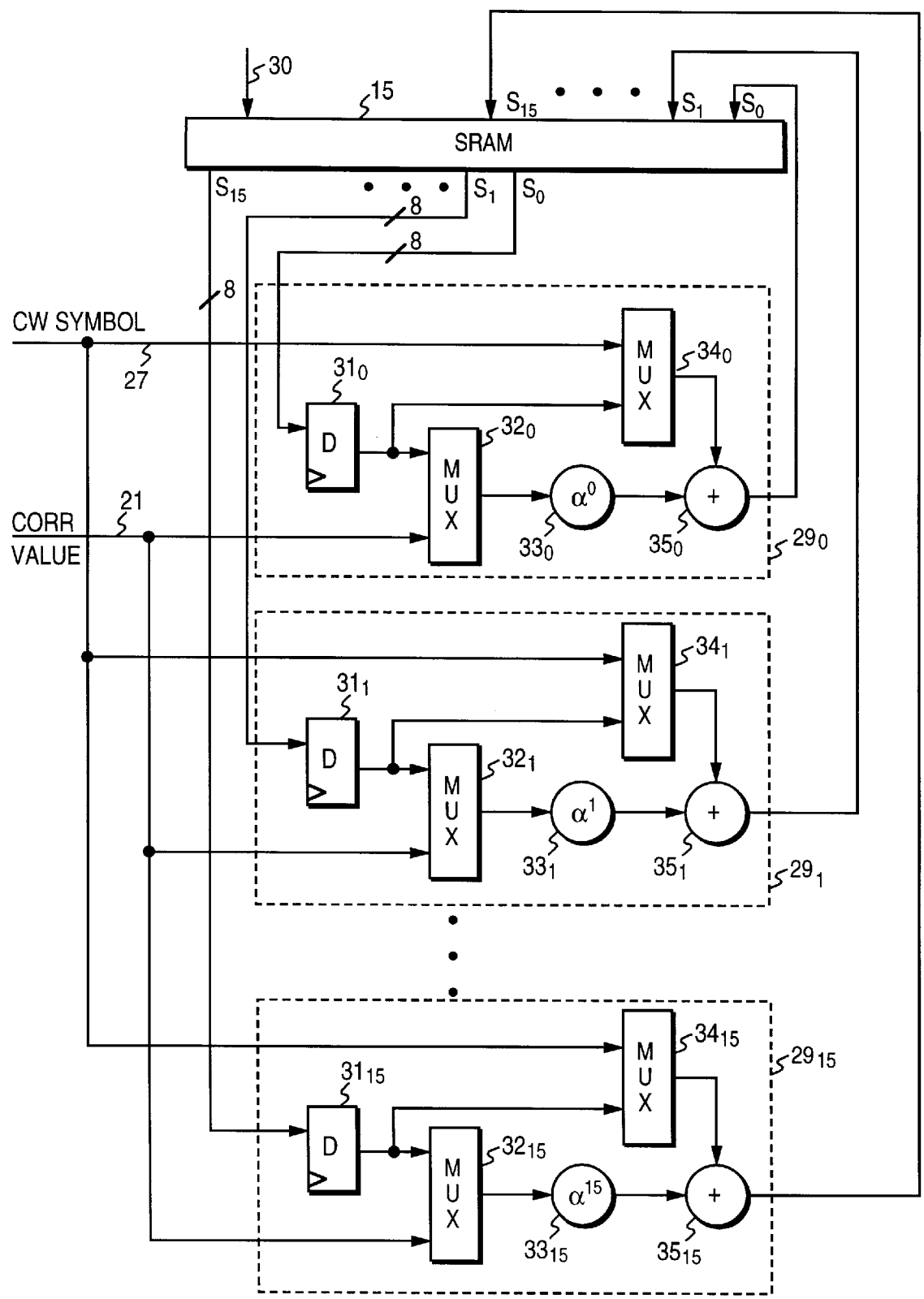
FIG. 5 shows detailed circuitry for generating the vertical codeword error syndromes concurrent with generating the error syndromes for the horizontal codewords.

The first embodiment of the present invention, which stores only the vertical error syndromes in the SRAM 15, is understood with reference to FIG. 4 and FIG. 5. FIG. 4 shows the circuitry used to generate the error syndromes for the horizontal codewords during each horizontal pass. That is, the horizontal error syndromes are always regenerated, they are not stored in the SRAM 15. To generate the horizontal error syndromes $S_i$, the circuitry in FIG. 4 computes the modulo division of each horizontal codeword C'(x) by the factors of the generator polynomial G(x):

$$S_i = C'(x) \text{MOD}(x+\alpha^i)$$

when $$G(x) = \prod_{i=0}^{m-1}(x+\alpha^i).$$

To carry out this computation, the symbols of a horizontal codeword (including the ECC redundancy) are read from the data buffer 1 sequentially and applied over line 27 to a bank of linear feedback shift registers (LFSR) $28_0$–$28_9$. In the preferred embodiment, each horizontal codeword comprises ten ECC redundancy symbols, as shown in FIG. 3A, thus there are ten LFSRs in FIG. 4, each with a corresponding $\alpha^i$ coefficient multiplier in the feedback path. Each LFSR performs the modulo division for each factor of the generator polynomial G(x) to thereby generate the error syndromes $S_i$ according to the above equation. The circuitry disclosed in FIG. 4 is well known by those skilled in the art—the novel aspect of the present invention lies in concurrently generating the error syndromes for the vertical codewords, the details of which are shown in FIG. 5.

Mathematically, the error syndromes for the vertical codewords are computed in the same way as for the horizontal codewords described above. That is, the vertical error syndromes $S_i$ are generated by computing the modulo division of each vertical codeword C'(x) by the factors of the generator polynomial G(x). The prior art syndrome generators typically employ the same circuitry shown in FIG. 4 to generate the vertical error syndromes; that is, the symbols of a vertical codeword (including the ECC redundancy) are read from the data buffer 1 sequentially and shifted through a bank of LFSRs. In the present invention, the vertical error syndromes are generated concurrent with generating the horizontal error syndromes in order to avoid accessing the data buffer to read the vertical codewords during a vertical pass.

The circuitry for concurrently generating the vertical error syndromes is shown in FIG. 5, the operation of which is understood with reference to the product code shown in FIG. 3A. The SRAM 15 has the capacity to store 16 error syndromes $S_i$ for each of the 182 vertical codewords. The vertical error syndromes $S_i$ in the SRAM 15 are initialized to zero at the beginning of the first horizontal pass. When processing the first horizontal codewords, the symbols are read from the data buffer 1 sequentially and applied over line 27 to the LFSR of FIG. 4 to generate the horizontal error syndromes. The symbols are simultaneously applied over line 27 to the circuitry shown in FIG. 5 to generate the vertical error syndromes. Similar to FIG. 4, FIG. 5 comprises a bank of syndrome generating circuits $29_0$–$29_{15}$ for computing the modulo division of the vertical codeword symbols by the 16 factors of the generator polynomial G(x) (each vertical codeword comprises 16 ECC redundancy symbols).

To understand the individual syndrome generating circuits $29_0$–$29_{15}$ shown in FIG. 5, consider the operation when the first horizontal codeword is read from the data buffer. The first symbol of the first horizontal codeword corresponds to the first symbol of the first vertical codeword. Thus, a control line 30 retrieves the 16 vertical error syndromes (8-bits each) from the SRAM 15 for the first vertical codeword. Each 8-bit vertical ECC syndrome is latched into a corresponding register $31_0$–$31_{15}$, selected as the output of a multiplexer $32_0$–$32_{15}$, and multiplied by a corresponding $\alpha^i$ feedback coefficient $33_0$–$33_{15}$. The codeword symbol on line 27 is selected as the output of a multiplexer $34_0$–$34_{15}$ which is added to the output of the coefficient multiplier at adder $35_0$–$35_{15}$. The updated syndromes at the output of the adders $35_0$–$35_{15}$ are then restored to the SRAM 15. When processing the second symbol of the first horizontal codeword, the control line 30 retrieves the 16 vertical error syndromes from the SRAM 15 for the second vertical codeword, and the above procedure is re-iterated. This process continues for each of the horizontal codewords and at the end of the horizontal pass, the error syndromes for correcting the vertical codewords are stored in the SRAM 15.

If a horizontal codeword is corrected during a horizontal pass, then the corresponding vertical error syndromes stored in the SRAM 15 must be updated to account for the corrected symbol. The syndrome generator 17 and the error corrector 18 of FIG. 2 preferably operate on adjacent codewords. In other words, while the syndrome generator 17 is generating the error syndromes for a current horizontal codeword, the error corrector 18 is correcting symbols for the previous horizontal codeword. In addition, the error correction trails generation of the horizontal error syndromes to simplify adjusting the vertical error syndromes with the correction values.

Consider, for example, that the syndrome generator 17 is generating the error syndromes for the second horizontal codeword in FIG. 3A, while the error corrector 18 is correcting the first horizontal codeword. Assume that the syndrome generator 17 has past the third symbol 36 of the second codeword and the third symbol 37 of the first codeword is in error. The error corrector 18 generates a correction value used to correct the third symbol 37 of the first horizontal codeword stored in the data buffer 1, and the correction value is also applied over line 21 to the vertical syndrome generating circuits $29_0$–$29_{15}$ of FIG. 5. The control line 30 retrieves the vertical error syndromes from the SRAM 15 for the third vertical codeword which are latched into the registers $31_0$–$31_{15}$. The outputs of the registers $31_0$–$31_{15}$ are then selected through the multiplexer $34_0$–$34_{15}$ as an input to the adders $35_0$–$35_{15}$. The correction value applied over line 21 is selected as the output of multiplexer $32_0$–$32_{15}$, multiplied by the corresponding $\alpha^i$ feedback coefficient $33_0$–$33_{15}$ and then added to the vertical error syndromes at adder $35_0$–$35_{15}$. Multiplying the correction value by the corresponding $\alpha^i$ feedback coefficient $33_0$–$33_{15}$ is necessary to account for the offset between the current vertical ECC syndrome value and the symbol being corrected (i.e., the offset of one symbol in the vertical codeword).

At the end of a horizontal pass, the error syndromes for the vertical codewords will be completely generated and available for immediate processing. Thus, to execute a vertical pass, the vertical error syndromes are simply retrieved from the SRAM 15 and used by the error corrector 18 to correct the vertical codewords. If after a vertical pass the CRC symbols of the product code indicate that errors still remain, then the above process is reiterated (i.e., the horizontal and vertical error syndromes are regenerated during the next horizontal pass).

In an alternative embodiment of the present invention, both the horizontal and vertical syndromes are stored in the SRAM 15 as they are being generated concurrently during the first horizontal pass. In this manner, it is not necessary to regenerate the horizontal syndromes during subsequent horizontal passes as in the previously described embodiment. The syndromes are simply retrieved during the horizontal and vertical passes and used to correct the codewords. This embodiment is particularly advantageous where multiple passes are necessary to correct the product code (e.g., if the ECC redundancy symbols are reduced, or if the SNR is decreased by increasing the recording density).

Figure 6A:
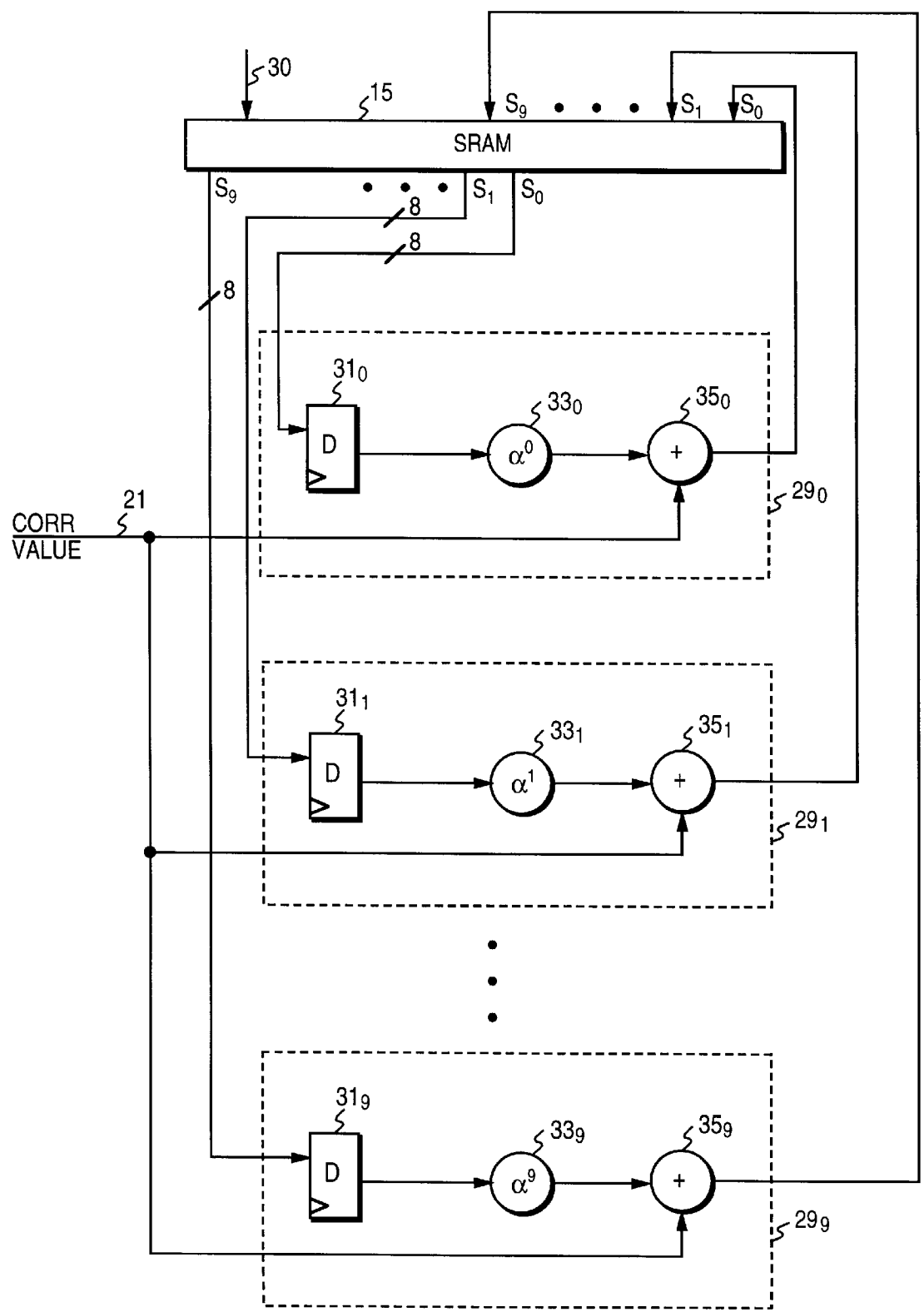
FIGS. 6A and 6B show, for an alternative embodiment of the present invention, the circuitry for updating the horizontal and vertical error syndromes, respectively, when the syndrome buffer stores the error syndromes for both the horizontal and vertical codewords.
Figure 6B:
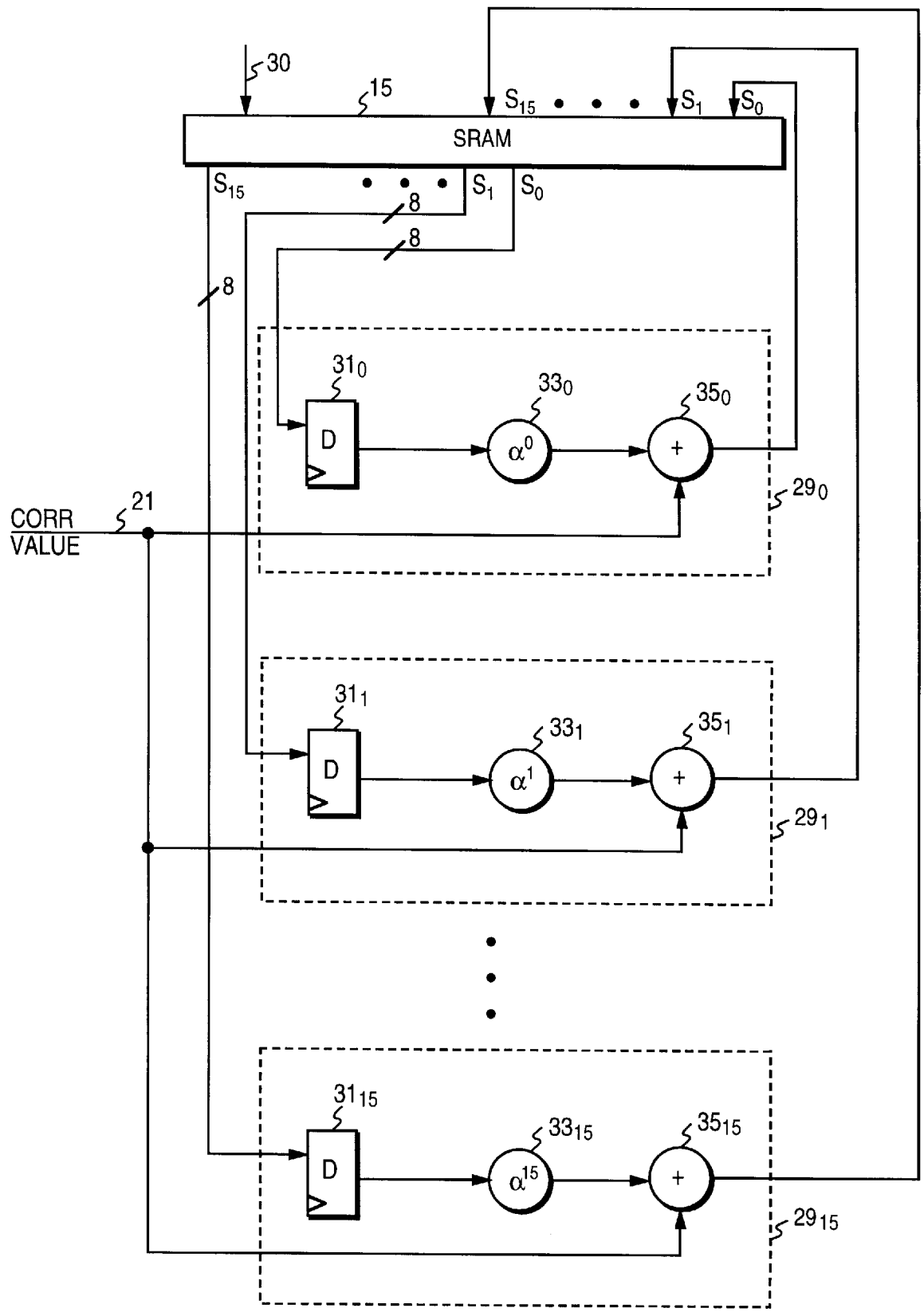

The circuitry for updating the vertical and horizontal syndromes using the correction values for this embodiment is shown in FIGS. 6A and 6B, respectively. These circuits operate substantially the same as the circuitry of FIG. 5, except that it is not necessary to multiply the error correction value 21 by $\alpha^i$ because there is no need to account for an offset. In the preferred embodiment, the circuitry of FIG. 4 and FIG. 5 for initially generating the horizontal and vertical error syndromes during the first horizontal pass is shared with the circuitry of FIGS. 6A and 6B for updating the error syndromes during subsequent passes. The addressing over control line 30 determines which set of error syndromes (horizontal or vertical) are retrieved from the SRAM 15 at the appropriate times.

Figure 7A:
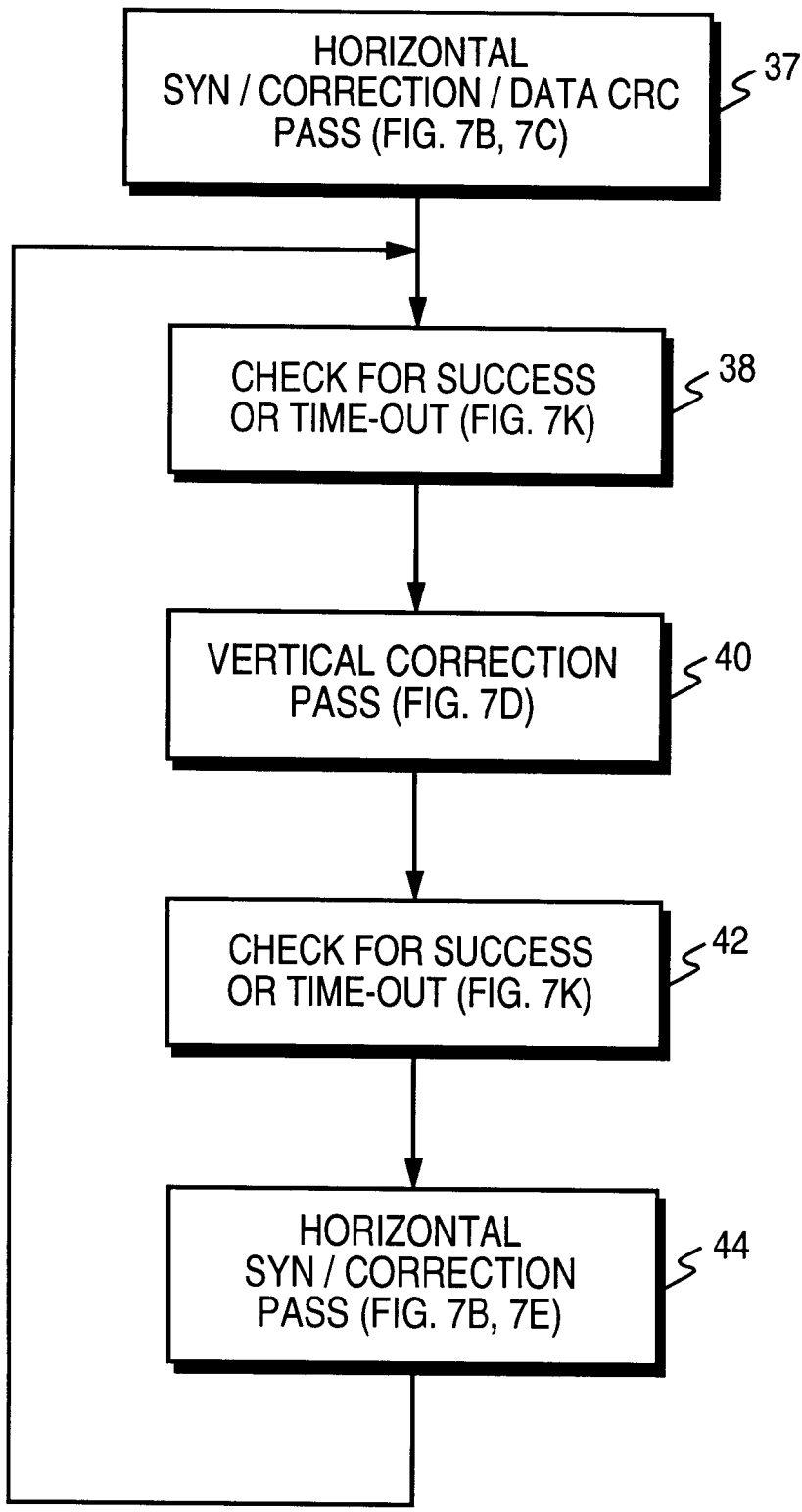
FIG. 7A is a flow diagram showing an overview of the steps executed by the error correction system of the present invention.

FIG. 7A is a flow diagram illustrating the operation of the present invention; the flow diagrams are executed by a controller not shown in the figures. During the first horizontal pass 37, the horizontal and vertical ECC syndromes as well as the data CRC syndromes are generated concurrently and stored in the SRAM 15. Also during the first horizontal pass 37, the horizontal codedwords are corrected and the correction values used to update the vertical syndromes as well as the error CRC syndromes stored in the SRAM 15. After the first and subsequent horizontal passes, the validity and completeness of the corrections to the product code are verified using the final CRC syndromes at step 38. If errors still remain after a horizontal pass, then a vertical pass is executed to correct vertical codewords at step 40, wherein the correction values are used to update the horizontal syndromes stored in the syndrome buffer. After a vertical pass, the validity and completeness of the corrections are again verified using the final CRC syndromes at step 42. If errors still remain after a vertical pass, then another horizontal pass is executed at step 44 to correct the horizontal codewords; the horizontal syndromes stored in the SRAM 15 are used to perform the corrections depending on the implementation (i.e., the horizontal syndromes are not regenerated if they are already available in the SRAM 15). The horizontal and vertical passes and the CRC check are re-iterated until the product code is corrected or deemed uncorrectable.

Figure 7B:
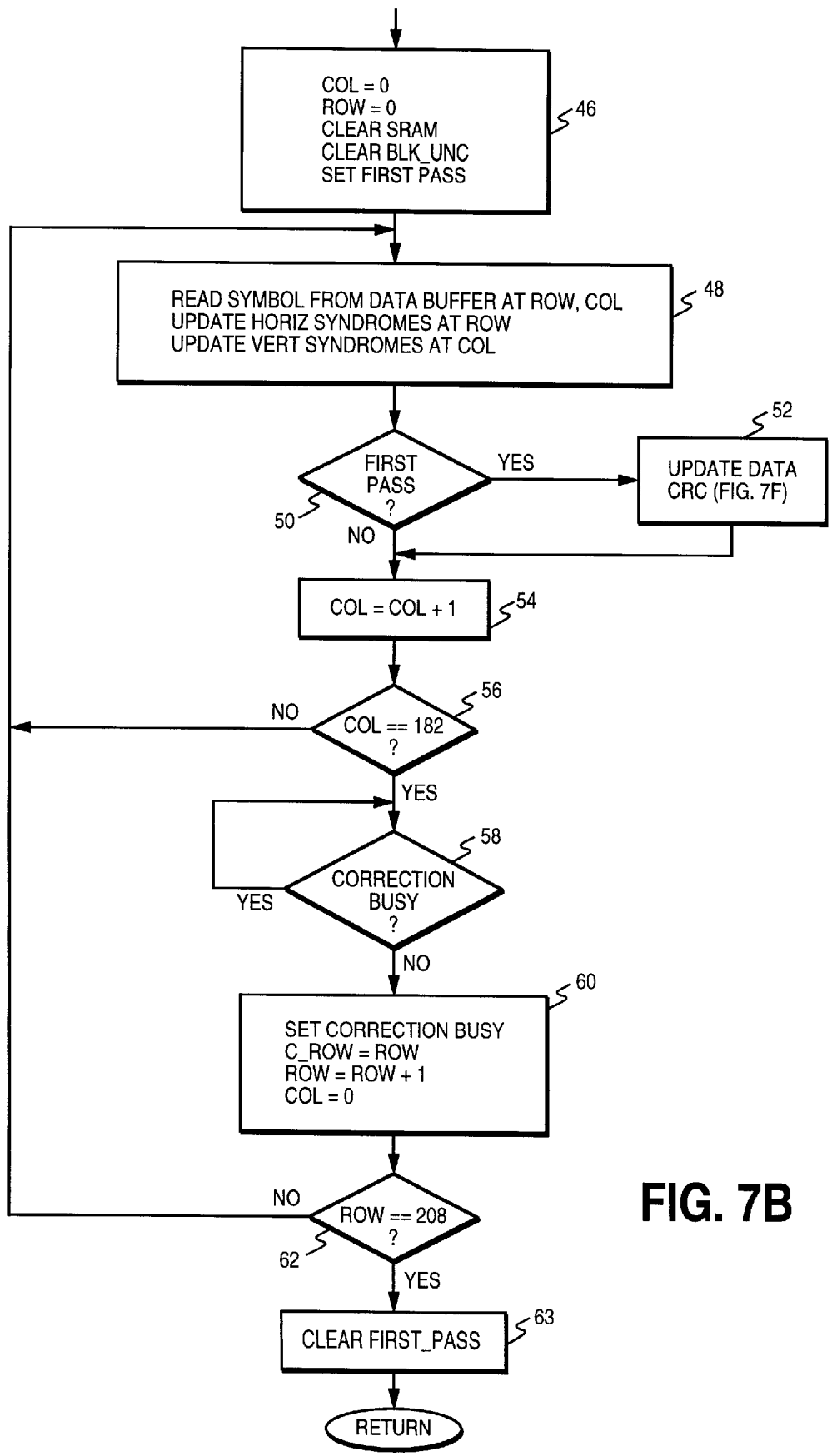
FIG. 7B is a flow diagram for concurrently generating the horizontal and vertical error syndromes during the first pass over the horizontal codewords, and for concurrently generating a CRC syndrome for checking the validity and completeness of the corrections to the product code.
Figure 7C:
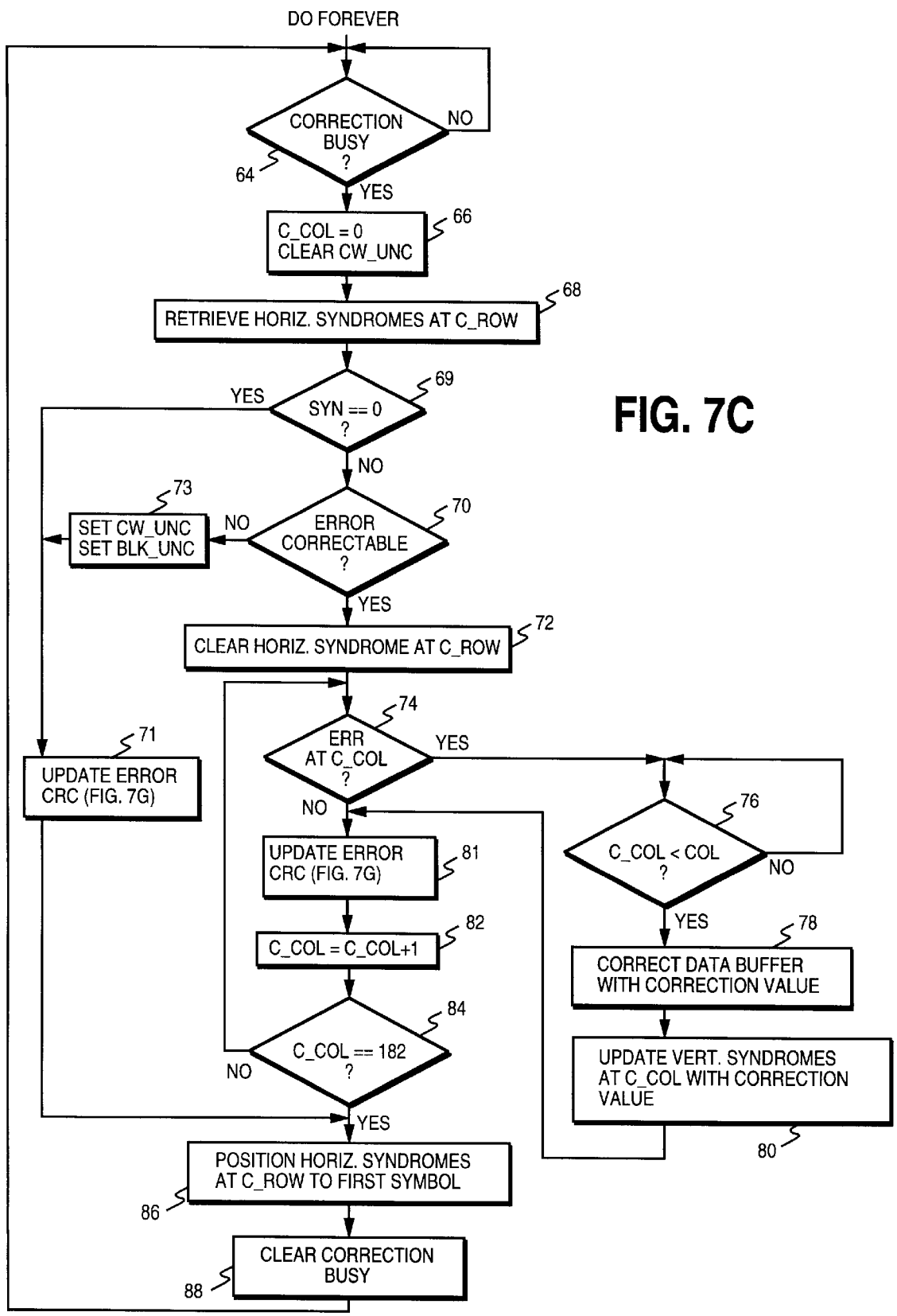
FIG. 7C is a flow diagram for correcting the horizontal codewords during the first (and subsequent) horizontal pass, and for updating the vertical error syndromes stored in the syndrome buffer and the CRC error register using the correction values.

The flow diagram for concurrently generating the horizontal and vertical syndromes and the data CRC syndromes during the first horizontal pass is shown in FIG. 7B, and the flow diagram for correcting the horizontal codewords and updating the vertical syndromes and error CRC syndromes using the correction values during the first pass is shown in FIG. 7C (the flow diagrams of FIGS. 7B and 7C are executed in parallel). Referring to FIG. 7B, at step 46 a COL and ROW variable are initialized to zero, the SRAM 15 is cleared, a block uncorrectable error flag (BLK_UNC) is cleared, and a FIRST_PASS flag is set to indicate this is the first horizontal pass. Then for the horizontal codeword at ROW, a symbol is read at step 48 and used to update the horizontal ECC syndromes using the circuitry of FIG. 4 and the vertical ECC syndromes using the circuitry of FIG. 5 as described above. If at step 50 the FIRST_PASS flag is set, then the data symbol is also used to update the data CRC syndromes at step 52 by executing the flow diagram of FIG. 7F. The COL variable is then incremented at step 54, and the next symbol for the current horizontal codeword is used to update the horizontal and vertical ECC syndromes as well as the data CRC syndromes during the first horizontal pass.

When the COL variable equals 182 at step 56, the last symbol for the current horizontal codeword has been read.

At step 58, a loop is executed to wait for the error correction procedure (flow diagram of FIG. 7C) to finish processing the previous horizontal codeword. When finished correcting the previous codeword, a correction flag is reset to not busy at step 88 of FIG. 7C. At step 60 of FIG. 7B, the correction flag is set to busy, a C_ROW variable is set to the current ROW, the ROW variable is incremented, and the COL variable is reset to zero. At this point, the correction procedure of FIG. 7C is executed to correct the current horizontal codeword (i.e., at C_ROW) concurrent with the ECC syndromes being generated for the next horizontal codeword (i.e., at ROW).

Referring to FIG. 7C, a loop is executed at step 64 to wait for the syndrome generator procedure of FIG. 7B to finish processing the current horizontal codeword and set the correction flag to busy. At step 66, a C_COL variable, which tracks the current column during correction, is reset to zero (i.e., reset to the first symbol in the horizontal codeword being corrected), and a codeword uncorrectable flag (CW_UNC) is cleared. The ECC syndromes for the horizontal codeword being corrected are retrieved from the SRAM 15 at step 68 to generate the error locator polynomial and to determine whether the roots correspond to valid symbol locations. If at step 69 the ECC syndromes are zero indicating there are no errors, then the error CRC syndromes are updated at step 71. If at step 70 the syndromes indicate there are too many errors or the roots of the error locator polynomial point to invalid symbols, then at step 73 the CW_UNC and BLK_UNC flags are set, indicating that the codeword and the entire block (product code) contain uncorrected errors, and the error CRC syndromes are updated at step 71. If the codeword is correctable at step 70, then at step 72 the ECC syndromes for the horizontal codeword at C_ROW are cleared (set to zero). A loop is then executed to correct the horizontal codeword at C_ROW. If at step 74 the symbol at C_COL is in error, then a branch is executed to correct the symbol stored in the data buffer and to update the vertical syndromes using the correction value. The correction is delayed until C_COL is less than COL at step 76; that is, the error correction procedure of FIG. 7C waits until the syndrome generation procedure of FIG. 7B has passed the current correction column C_COL. This is necessary in order for the circuitry of FIG. 5 to work correctly because it multiplies the correction value 21 by $\alpha^i$ $33_i$ to account for the offset of one symbol. At step 78 of FIG. 7C, the horizontal codeword symbol stored in the data buffer is corrected using the correction value, and at step 80 the correction value is used to update the vertical syndromes for the vertical codeword at C_COL as described above with reference to FIG. 5. At step 81 the error CRC syndromes are updated with the correction value (even if the correction value is zero), and at step 82 the variable C_COL is incremented to the next symbol in the horizontal codeword and the correction loop is re-executed.

When C_COL equals 182 at step 84, the last symbol of the horizontal codeword being corrected has been processed. To facilitate updating the error syndromes for the current horizontal codeword during the next vertical pass, its error syndromes are repositioned to the first codeword symbol at step 86. This is carried out by the following computation:

$$SYN_i = SYN_i \cdot x^{-182} \text{MOD}(x + \alpha^i).$$

The circuitry for performing the above operation is discussed in greater detail below.

At step 88 of FIG. 7C, the correction busy flag is cleared and the correction procedure waits at step 64 for the syndrome generation procedure of FIG. 7B to finish generating the error syndromes for the next horizontal codeword. The syndrome generation and error correction procedures execute in parallel until the last horizontal codeword has been processed (i.e., ROW equals 208 at step 62 of FIG. 7B), wherein the FIRST_PASS flag is cleared at step 63 and control returns to FIG. 7A. If at step 38 of FIG. 7A errors still remain after the first horizontal pass, then a vertical pass is executed at step 40, the flow diagram for which is set forth in FIG. 7D.

At step 90, the correction variables C_COL and C_ROW are reset to zero (i.e., reset to the first symbol of the first vertical codeword), and the codeword uncorrectable flag (CW_UNC) is cleared. The syndromes for the vertical codeword being corrected are then retrieved from the SRAM 15 at step 92 to generate the error locator polynomial and to determine whether the roots correspond to valid symbol locations. If at step 93 the ECC syndromes are zero indicating there are no errors, then the error CRC syndromes are updated at step 95. If at step 94 the syndromes indicate there are too many errors or the roots of the error locator polynomial point to invalid symbols, then at step 97 the CW_UNC and BLK_UNC flags are set and the error CRC syndromes updated at step 95. If the codeword is correctable at step 94, then at step 96 the ECC syndromes for the vertical codeword at C_COL are cleared (set to zero). A loop is then executed to correct the vertical codeword at C_COL. If at step 98 the symbol at C_ROW is in error, then a branch is executed to correct the symbol stored in the data buffer at step 100 and to update the horizontal syndromes using the correction value at step 102. The circuitry of FIG. 6A is used to update the horizontal syndromes in a similar manner as described above with reference to FIG. 5. The horizontal ECC syndromes at C_ROW are retrieved from the SRAM 15, multiplied by $\alpha^i$ $33_i$, added to the correction value $35_i$, and then returned to the SRAM 15. Although not shown in the flow chart of FIG. 7D, the horizontal syndromes are updated for each symbol in the codeword even if no correction is made (i.e., even if the correction value is zero). This simplifies the syndrome update circuitry of FIG. 6A—it requires only a $\alpha^i$ multiplier $33_i$ to position the ECC syndrome to the next codeword symbol.

Figure 7D:
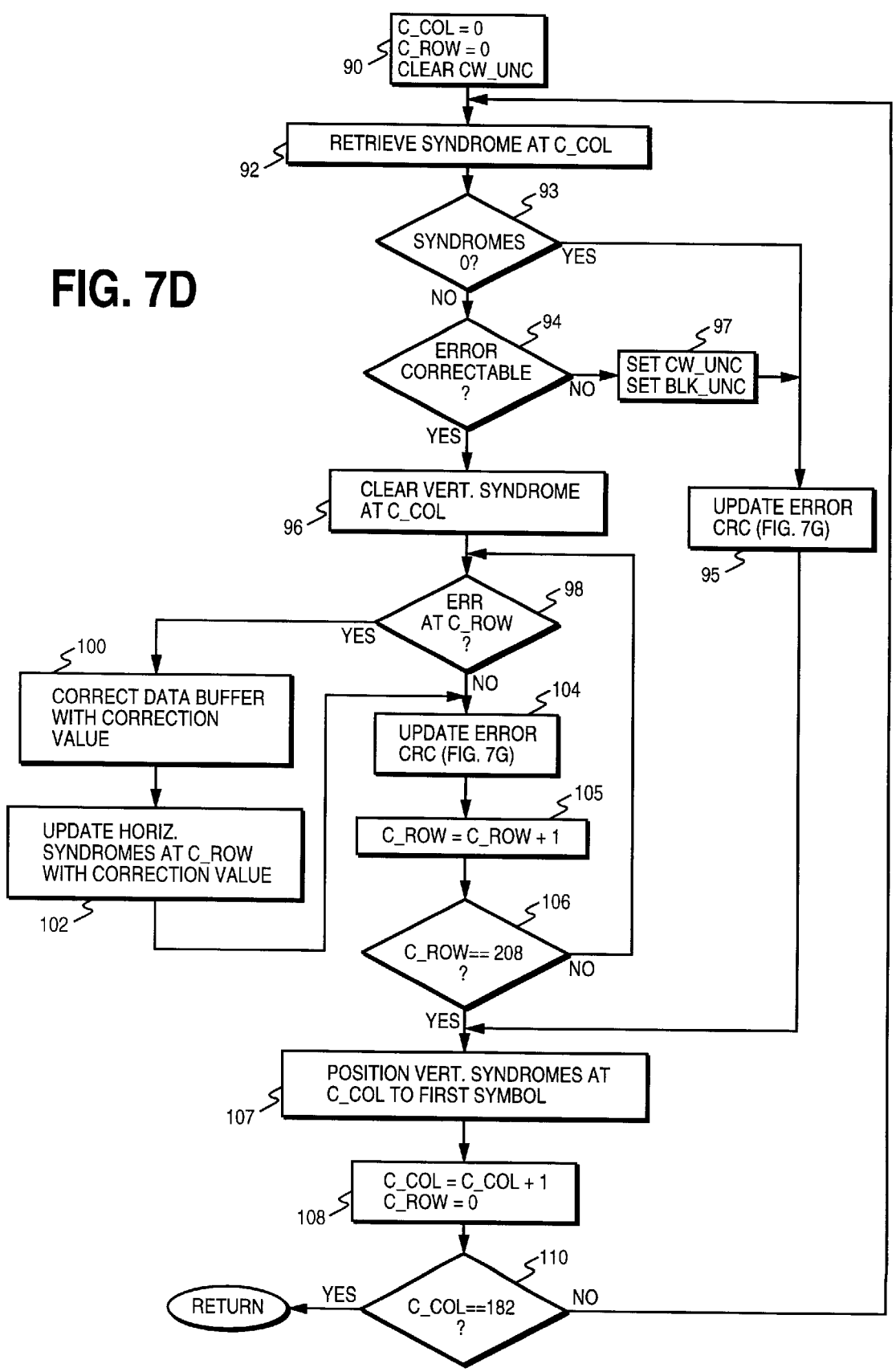
FIG. 7D is a flow diagram for correcting the vertical codewords during a vertical pass using the vertical error syndromes stored in the syndrome buffer, and for updating the horizontal error syndromes stored in the syndrome buffer and the CRC error register with the correction values.

At step 104 of FIG. 7D, the error CRC syndromes are updated with the correction value (even if the correction value is zero), and at step 105 the C_ROW variable is incremented to the next symbol in the current vertical codeword. The correction loop is re-iterated until C_ROW equals 208 at step 106, wherein the last symbol of the current vertical codeword has been processed. After the last symbol has been processed (or if the codeword is uncorrectable at step 94), then the error syndromes for the vertical codeword at C_COL are repositioned to the first symbol of the codeword at step 107. This is carried out by the following computation:

$$SYN_i = SYN_i \cdot x^{-208} \text{MOD}(x + \alpha^i).$$

The circuitry for performing the above operation is discussed in greater detail below.

At step 108, the C_COL variable is incremented to the next vertical codeword and the C_ROW variable is reset to zero to point to the first symbol of the next vertical codeword. The correction procedure of FIG. 7D is re-iterated until C_COL equals 182 at step 110 indicating that all of the vertical codewords have been processed.

At the end of a vertical pass, if errors still remain in the product code at step 42, then a horizontal correction pass is executed at step 44. If the horizontal syndromes are not stored in the SRAM 15, then the flow diagram of FIG. 7B is executed at step 44 to regenerate the horizontal ECC syndromes (with FIRST_PASS false). However, if the horizontal ECC syndromes are stored in the SRAM 15, then the flow diagram of FIG. 7E is executed to simply retrieve and process the ECC syndromes which reduces the latency of the correction system.

Figure 7E:
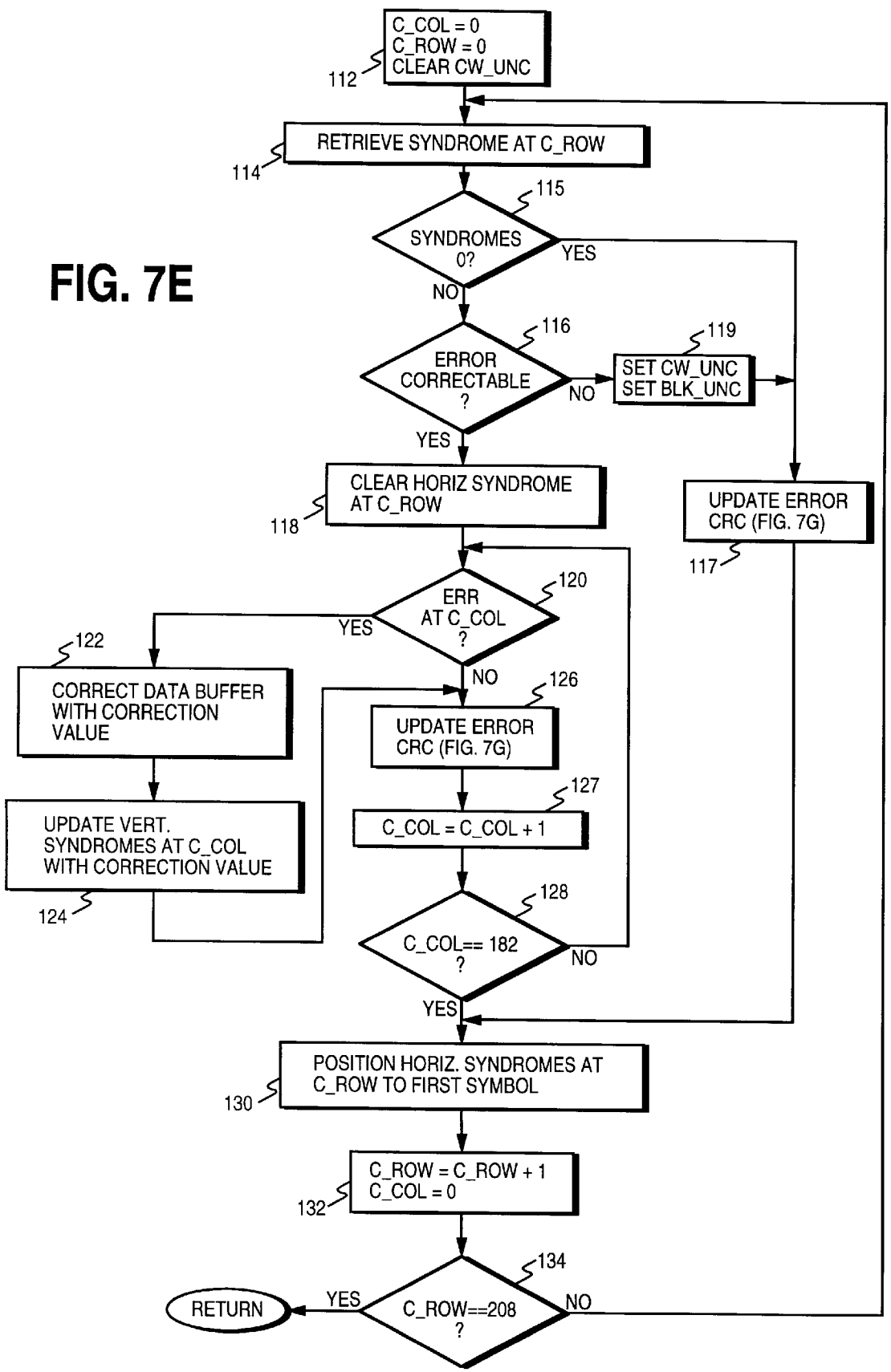
FIG. 7E is a flow diagram for correcting the horizontal codewords during subsequent horizontal passes using horizontal error syndromes stored in the syndrome buffer, and for updating the vertical error syndromes stored in the syndrome buffer and the CRC error register with the correction values.

At step 112 of FIG. 7E, the correction variables C_COL and C_ROW are reset to zero (i.e., reset to the first symbol of the first horizontal codeword), and the codeword uncorrectable flag (CW_UNC) is cleared. The syndromes for the horizontal codeword being corrected are then retrieved from the SRAM 15 at step 114 to generate the error locator polynomial and to determine whether the roots correspond to valid symbol locations. If at step 115 the ECC syndromes are zero indicating there are no errors, then the error CRC syndromes are updated at step 117. If at step 116 the syndromes indicate there are too many errors or the roots of the error locator polynomial point to invalid symbols, then at step 119 the CW_UNC and BLK_UNC flags are set, indicating that the codeword and the entire block (product code) contain uncorrected errors, and the error CRC syndromes are updated at step 117. If the codeword is correctable at step 116, then at step 118 the ECC syndromes for the horizontal codeword at C_ROW are cleared (set to zero). A loop is then executed to correct the horizontal codeword at C_ROW.

If at step 120 the symbol at C_COL is in error, then a branch is executed to correct the symbol stored in the data buffer at step 122 and to update the vertical syndromes using the correction value at step 124. The circuitry of FIG. 6B is used to update the vertical ECC syndromes in a similar manner as described above with reference to FIG. 6A for updating the horizontal ECC syndromes during a vertical pass. The vertical ECC syndromes at C_COL are retrieved from the SRAM 15, multiplied by $\alpha^i$ $33_i$, added to the correction value $35_i$, and then returned to the SRAM 15. Although not shown in the flow chart of FIG. 7E, the vertical ECC syndromes are updated for each symbol in the codeword even if no correction is made (i.e., even if the correction value is zero). This simplifies the syndrome update circuitry of FIG. 6B—it requires only a $\alpha^i$ multiplier $33_i$ to position the ECC syndrome to the next codeword symbol.

At step 126 of FIG. 7E, the error CRC is updated using the correction value (even if the correction value is zero), and at step 127 the C_COL variable is incremented to the next symbol in the current horizontal codeword. If at step 128 C_COL equals 182, then the last symbol of the current horizontal codeword has been processed. After the last symbol has been processed (or if the codeword is uncorrectable at step 116), then the error syndromes for the horizontal codeword at C_ROW are repositioned to the first symbol of the codeword at step 130. This is carried out by the above computation:

$$SYN_i = SYN_i \cdot x^{-182} MOD(x + \alpha^i).$$

At step 132, the C_ROW variable is incremented to the next horizontal codeword and the C_COL variable is reset to zero to point to the first symbol of the next horizontal codeword. The correction procedure of FIG. 7E is re-iterated until C_ROW equals 208 at step 134 indicating that all of the horizontal codewords have been processed.

Referring again to FIG. 7A, if after completing a horizontal pass at step 44 errors still remain, then another vertical pass is executed at step 40. The iterative horizontal and vertical passes continue until the product code is corrected or deemed uncorrectable. The flow diagrams for generating the data and error CRC syndromes for each data sector are shown in FIGS. 7G–7I, and the circuitry for generating the CRC syndromes are shown in FIGS. 8–11; the flow diagrams and circuitry operate as follows.

CRC Syndrome Generation and Verification

The CRC syndrome for each data sector of FIG. 3A is generated in two parts: a data CRC syndrome and an error CRC syndrome. The data CRC syndrome is generated as the CRC over the uncorrected data, and the error CRC syndrome is generated as the CRC over the correction values. When finished processing a data sector in the product code of FIG. 3A, the data and error CRC syndromes are combined to generate a final CRC syndrome and compared to a constant to determine if the corrections to that sector are valid and complete. As discussed above, the data and error CRC syndromes are generated concurrent with correcting the product code over the randomized data—it is not generated after correction and after derandomizing the data as in the prior art.

In the prior art error correction system of FIG. 1, the CRC redundancy symbols $CRC_{RED}$ are generated as the modulo division of the data polynomial $D(x)$ divided by the generator polynomial $G(x)$ $$CRC_{RED} = D(x) \cdot x^{n-k} \mod G(x).$$

After adding the CRC redundancy symbols $CRC_{RED}$ to the data polynomial $D(x)$, the data is randomized by adding the pseudo random data sequence polynomial $R(x)$ resulting in the codeword polynomial $C(x)$ written to the disk $$C(x) = (D(x) \cdot x^{n-k} + CRC_{RED}) + R(x).$$

Upon read back, the received codeword polynomial $C'(x)$ is corrected using the ECC redundancy symbols, the pseudo random data sequence $R(x)$ is subtracted from the corrected codeword, and the CRC syndrome $S_{CRC}$ is generated as $$S_{CRC} = (C'(x) - R(x)) \mod G(x).$$

The CRC syndrome $S_{CRC}$ is then compared to zero to verify the validity and completeness of the corrections.

In the present invention, the CRC check is performed before derandomizing the corrected codeword. The enabling modification of the present invention is to compare the final CRC syndrome to the CRC over the pseudo random data sequence used to randomize/derandomize the data. This is understood from the following mathematical relationships $$CRC_{RED} = D(x) \cdot x^{n-k} \mod G(x)$$

$$C(x) = (D(x) \cdot x^{n-k} + CRC_{RED}) + R(x)$$

where $D(x)$ is the data polynomial, $CRC_{RED}$ is the CRC redundancy, and $R(x)$ is the pseudo random data sequence polynomial added to the data polynomial in order to randomize the data. The resulting codeword $C(x)$ written to the disk is the same as in the prior art described above. However, if the received codeword $C'(x)$ is divided by the CRC generator polynomial before derandomizing the data (i.e., before subtracting the pseudo random data sequence polynomial $R(x)$), it leads to the following relationship $$C'(x) \mod G(x) = (D(x) \cdot x^{n-k} + CRC_{RED} + R(x) + E(x)) \mod G(x))$$

where $E(x)$ is an error polynomial. The above equation can be rewritten as $$C'(x) \mod G(x) = (D(x) \cdot x^{n-k} + CRC_{RED}) \mod G(x) + E(x) \mod G(x) + R(x) \mod G(x).$$

In the above equation, $(D(x) \cdot x^{n-k} + CRC_{RED}) \bmod G(x) = 0$, therefore $$C'(x) \bmod G(x) = (E(x) \bmod G(x)) + (R(x) \bmod G(x)).$$

Thus, if the received codeword C'(x) has been completely corrected using the ECC redundancy (i.e., E(x)=0), then the final CRC syndrome generated over the received codeword C'(x) will equal the modulo division of the pseudo random data sequence R(x) divided by the CRC generator polynomial G(x) as seen from the above equation. Since the pseudo random data sequence R(x) and the generator polynomial G(x) are known, modulo dividing the pseudo random data sequence R(x) by the generator polynomial G(x) results in a constant; the final CRC syndrome is simply compared to this constant to determine if the corrections using the ECC syndromes are valid and complete. Because the CRC syndromes are generated concurrent with correcting the received codeword, the CRC syndromes are available immediately; it is not necessary to read the entire codeword from the data buffer in order to generate the CRC syndromes as in the prior art.

In order to generate the CRC syndrome concurrent with correcting the received codeword, the present invention generates a data CRC syndrome over the uncorrected data during the first horizontal pass, and an error CRC syndrome over the correction values during both the horizontal and vertical passes. When finished processing a data sector in the product code of FIG. 3A, the data and error CRC syndromes are combined to generate the final CRC syndrome which is compared to the constant (R(x) mod G(x)).

In the present invention, the data and error CRC syndromes are not generated in the conventional manner (i.e., using a linear feedback shift register (LFSR)) because the data symbols are not read sequentially from the data buffer during a vertical pass. Instead, the data and CRC syndromes are adjusted to correspond to the location of the data symbol being processed. This adjustment is carried out by multiplying the data and error CRC syndromes by $$X^{k-8} \bmod G(x)$$

where k represents the number of symbols to "move" the syndrome through the codeword. For example, when generating the data CRC syndrome during the first horizontal pass, the data CRC syndrome is multiplied by $$X^{1-8} \bmod G(x)$$

in order to adjust the data CRC syndrome to the next symbol of the current horizontal codeword. During a vertical pass, the error CRC syndrome is multiplied by $$X^{182-8} \bmod G(x)$$

in order to adjust the error CRC syndrome to the next symbol of the current vertical codeword. A mathematical foundation for this method of generating the CRC syndromes is provided below with reference to the circuitry for implementing the CRC generator and correction validator.

As seen in FIG. 3A, there are sixteen data sectors each with appended CRC redundancy. Therefore, there are sixteen data CRC syndromes generated during the first horizontal pass, and sixteen error CRC syndromes updated during both the horizontal and vertical passes. These syndromes are advantageously stored in the SRAM 15, thereby using the SRAM 15 for both CIRC error correction for the CD ROM format as well as CRC syndrome generation for DVD format. The current data CRC syndrome is initialized with a starting value with each new sector processed during the first horizontal pass. Before initializing the data CRC syndrome with a starting value for the next sector, the current data CRC syndrome for the previous data sector is stored in the SRAM 15. Similarly, when processing a vertical codeword, the appropriate error CRC syndrome that corresponds to the current data sector is retrieved from the SRAM 15 as the error correction system progresses vertically through the sixteen data sectors. This process of updating the data and error CRC syndromes according to the current data sector being processed is understood from the flow diagrams of FIGS. 7F–7J.

Figure 7F:
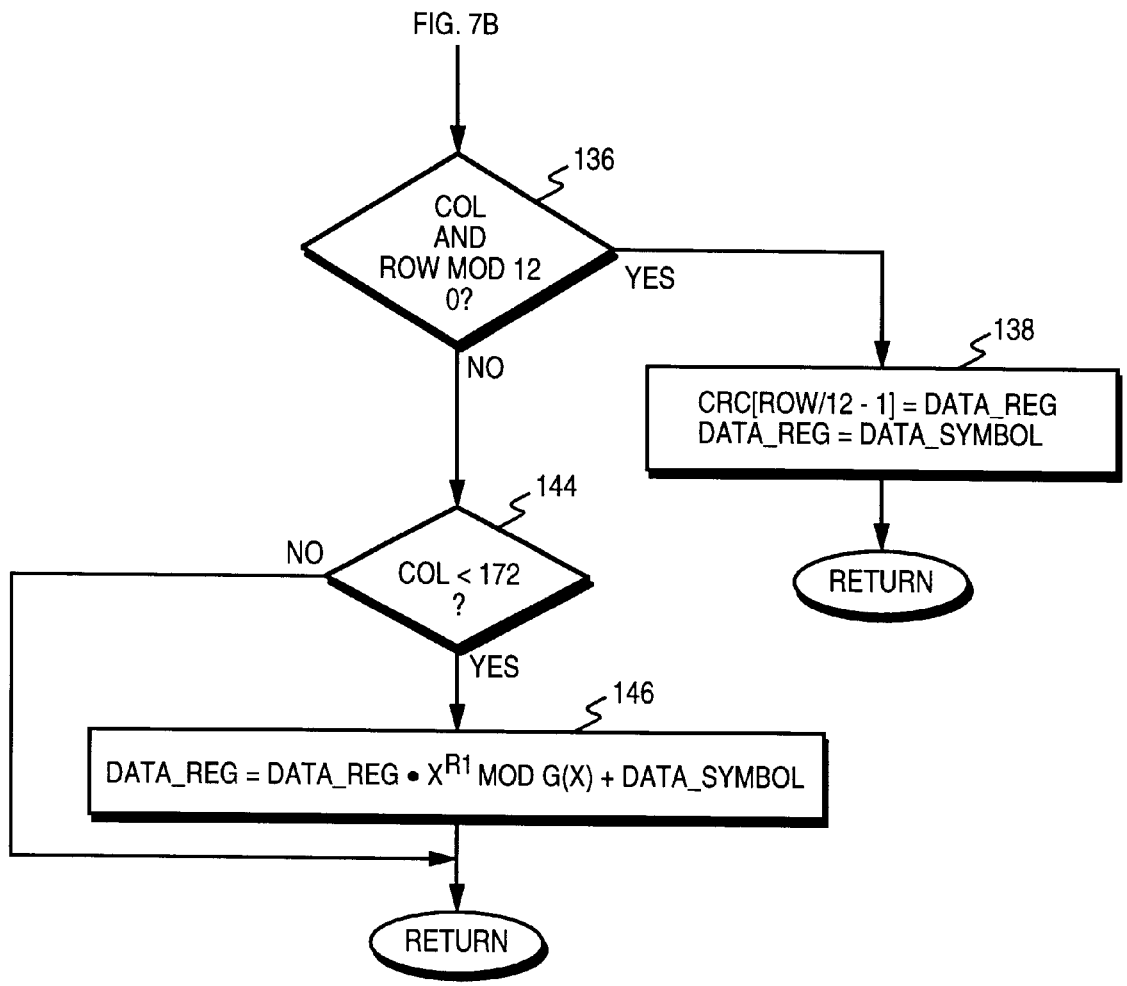
FIG. 7F is a flow diagram for generating the data CRC syndrome during the first horizontal pass over the entire product code.
Figure 7G:
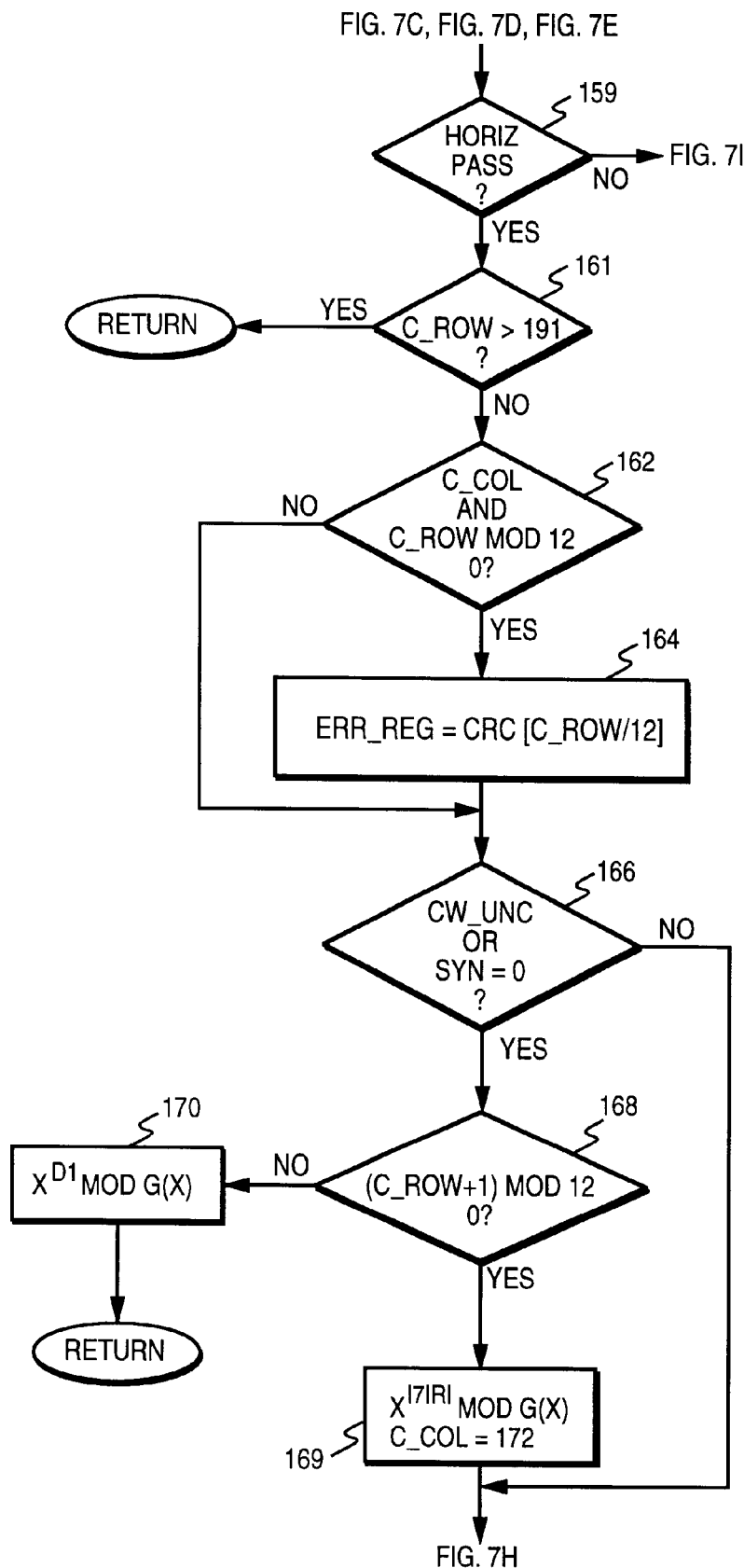
FIGS. 7G and 7H show a flow diagram for updating the error CRC syndrome using the correction values during a horizontal pass.
Figure 7H:
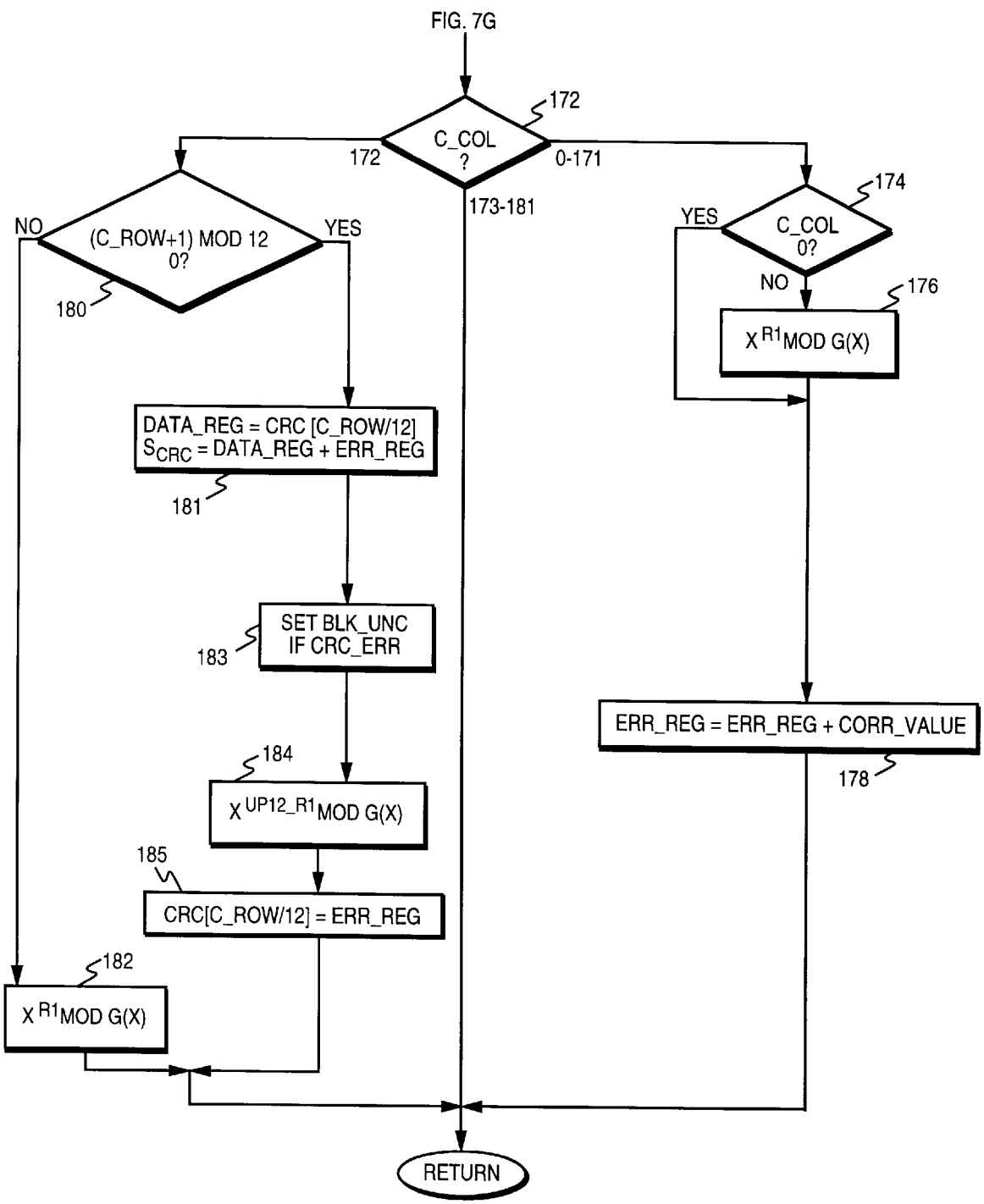
Figure 7I:
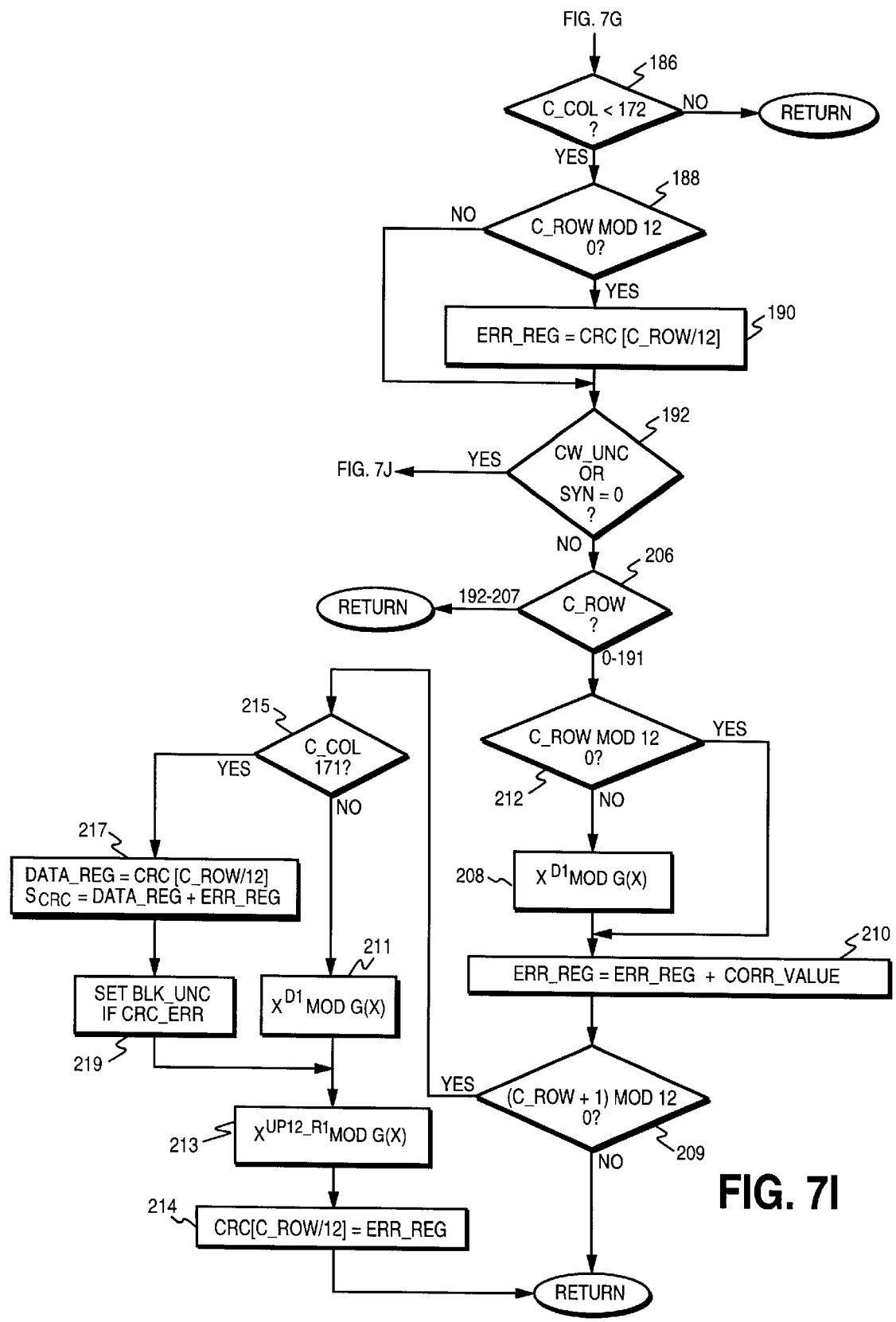
FIGS. 7I and 7J show a flow diagram for updating the error CRC syndrome using the correction values during a vertical pass.

FIG. 7F shows the flow diagram for generating the data CRC syndrome during the first horizontal pass over the product code of FIG. 3A, the first two data sectors of which are shown in FIG. 3B. The flow diagram of FIG. 7F is executed each time a new data symbol is read from the data buffer at step 52 of FIG. 7B. At step 136 of FIG. 7F, a check is performed to determine if the data CRC syndrome should be initialized to the first symbol of the next data sector. For example, when processing the first symbol of the first horizontal codeword, a data register DATA_REG which stores the data CRC syndrome is initialized at step 138 with the first symbol 160 of the first data sector of FIG. 3B. When the next data sector is reached (i.e., ROW equals 12 at step 136), then at step 138 the data CRC syndrome for the first data sector is saved in the SRAM 15 and the DATA_REG is initialized with the first data symbol 204 for the next horizontal codeword.

Continuing now with the flow diagram of FIG. 7F, if not processing the first symbol of the data sector and at step 144 COL is less than 172, then at step 146 the data CRC syndrome is adjusted right by one symbol (one column) and the current data symbol is added to the data CRC syndrome. If at step 144 COL is greater than 171, then the current data symbol is not added into the data CRC syndrome because it is an ECC redundancy symbol which is not included in the CRC codeword (the ECC redundancy are added after the CRC codeword is generated during the write operation as described above). For example, when processing the first horizontal codeword of FIG. 3B, generation of the data CRC syndrome pauses at symbol 148 until COL is reset to zero at step 60 of FIG. 7B to begin processing the next horizontal codeword. Then at step 146, the data CRC syndrome is first adjusted to the right by one symbol (i.e., to symbol 150 of FIG. 3B) before adding the first data symbol 150 of the second horizontal codeword to the data CRC syndrome.

When finished processing the last horizontal codeword of a data sector (i.e., when ROW+1 mod 12 equals 0 at step 154 and when COL equals 181 at step 156), the data CRC syndromes will be positioned to the last symbol of their corresponding data sectors. For example, when finished processing the first data sector, the data CRC syndrome will be positioned over symbol 152 of FIG. 3B. As described below, each corresponding error CRC syndrome is also positioned to the last data symbol of the data sector before performing the CRC check.

After processing the first data sector, then at step 136 of FIG. 7F ROW equals 12 and ROW mod 12 equals zero. Therefore, at step 138 the current data CRC syndrome for the first data sector is saved into the SRAM 15, and the DATA_REG is initialized with the starting location for the second data sector (i.e., to symbol 142 of FIG. 3B) which is retrieved from the SRAM 15. The data symbols for the CRC codeword of the second data sector are added to the data CRC syndrome at step 146. This process continues until all sixteen data CRC syndromes have been generated and stored in the SRAM 15.

The flow diagrams for generating the error CRC syndromes during a horizontal and vertical pass are shown in FIGS. 7G–7J. During the first horizontal pass, the error CRC syndromes are updated with the correction values at step 81 of FIG. 7C (even if the correction value is zero). At step 159 of FIG. 7G, a branch is executed depending on whether the current pass is horizontal or vertical. If currently performing a horizontal pass, then if at step 161 C_ROW is greater than 191, the error CRC syndrome is not updated since the ECC redundancy are not part of the CRC syndrome. Otherwise, if at step 162 the correction column C_COL and the correction row C_ROW mod 12 are zero, then at step 164 the register for generating the error CRC syndrome ERR_REG is loaded with the partial error CRC syndrome from the SRAM 15 corresponding to the current data sector.

If at step 166 the codeword is uncorrectable (i.e., the uncorrectable flag (CW_UNC) is set) or the ECC syndromes for the current horizontal codeword are zero indicating that no corrections can be made, then a branch is executed at step 168 depending on whether it is the last horizontal codeword of the current data sector. If it is the last codeword of the data sector (i.e., C_ROW+1 MOD 12 equals zero), then at step 169 the error CRC syndrome for the current data sector is positioned to the last symbol of the CRC codeword (e.g., from symbol 158 to symbol 152 of FIG. 3B) by shifting the error CRC syndrome right 171 symbols, and C_COL is set to 172. To reduce the number of multiplication tables described below, shifting the error CRC syndrome to the right by 171 symbols in step 169 is carried out in a loop where the error CRC syndrome is shifted right by one symbol 171 times. If the current codeword is not the last codeword of the data sector, then the error CRC syndrome is simply adjusted down one row at step 170 to skip the current horizontal codeword; thereafter control returns FIG. 7E to continue processing the next horizontal codeword of the data sector.

If at step 166 the codeword uncorrectable flag (CW_UNC) is not set and the ECC syndromes for the current horizontal codeword are not zero, then a branch is executed at step 172 of FIG. 7H based on the value of the current correction column C_COL. If C_COL is 0–171, then if not processing the first data symbol of the current horizontal codeword (i.e., if C_COL does not equal 0 at step 174) the error CRC syndrome is adjusted right one symbol (one column) at step 176 and the correction value for the current data symbol is added to the error CRC syndrome at step 178. This process continues until all of the correction values for the current horizontal codeword have been added to the error CRC syndrome. The ECC symbols of the horizontal codewords (i.e., when C_COL equals 173—180 at step 172) are not added into the error CRC syndrome because they are not part of the CRC codeword as described above. When the last data symbol of the current horizontal codeword has been processed (i.e., when C_COL equals 172 at step 172) then at step 180 the error CRC syndrome is adjusted based on whether the current horizontal codeword is the last codeword of the current data sector. If it is not the last horizontal codeword of the data sector (i.e., if (ROW+1) mod 12 is not 0 at step 180) then at step 182 the error CRC syndrome is adjusted right one symbol to position it over the first symbol of the next horizontal codeword. If the current horizontal codeword is the last codeword of the current data sector, then at step 181 the DATA_REG is loaded from the SRAM 15 with the data CRC syndrome for the current data sector and combined with the ERR_REG. If the result does not equal the CRC over the pseudo random sequence, as described above, then the block uncorrectable flag (BLK_UNC) flag is set at step 183. Then at step 184, the error CRC syndrome is adjusted up 12 rows and right one symbol in order to reposition it over the first symbol of the data sector. For example, with the error CRC syndrome positioned at the last symbol 152 of the CRC codeword of the first data sector of FIG. 3B, then adjusting the error CRC syndrome up 12 rows and right one symbol at step 184 will position the error CRC syndrome to the first symbol 160 of the data sector. At step 185, the error CRC syndrome for the current data sector (stored in ERR_REG) is then restored to the SRAM 15.

The error CRC update procedure of FIG. 7G and 7H is re-iterated until the error CRC syndromes have been generated for all sixteen data sectors of FIG. 3A and compared to the CRC over the pseudo random sequence. At the end of the first horizontal pass, the BLK_UNC flag is examined at step 254 of FIG. 7K to verify the validity and completeness of the corrections to the product code. If errors still remain, then a vertical pass is executed and the error CRC update procedure of FIG. 7I is executed to update the error CRC syndromes with the correction values applied to the vertical codewords at step 104 (or at step 95 if the vertical codeword is skipped) of FIG. 7D.

At step 159 of FIG. 7G, control branches to FIG. 7I to update the error CRC syndromes for a vertical pass. If at step 186 of FIG. 7I the current correction column C_COL is greater than 171, then nothing is updated since the vertical codewords over the horizontal ECC symbols are not included in the CRC codewords. If at step 186 C_COL is less than 172, then a check is made at step 188 to determine if the error CRC syndrome has reached the last row of the current data sector as it progresses down the current vertical codeword. If the current correction row C_ROW mod 12 equals zero, then at step 190 the partial error CRC syndrome for the current data sector is retrieved from the SRAM 15 and loaded into the ERR_REG.

Figure 7J:
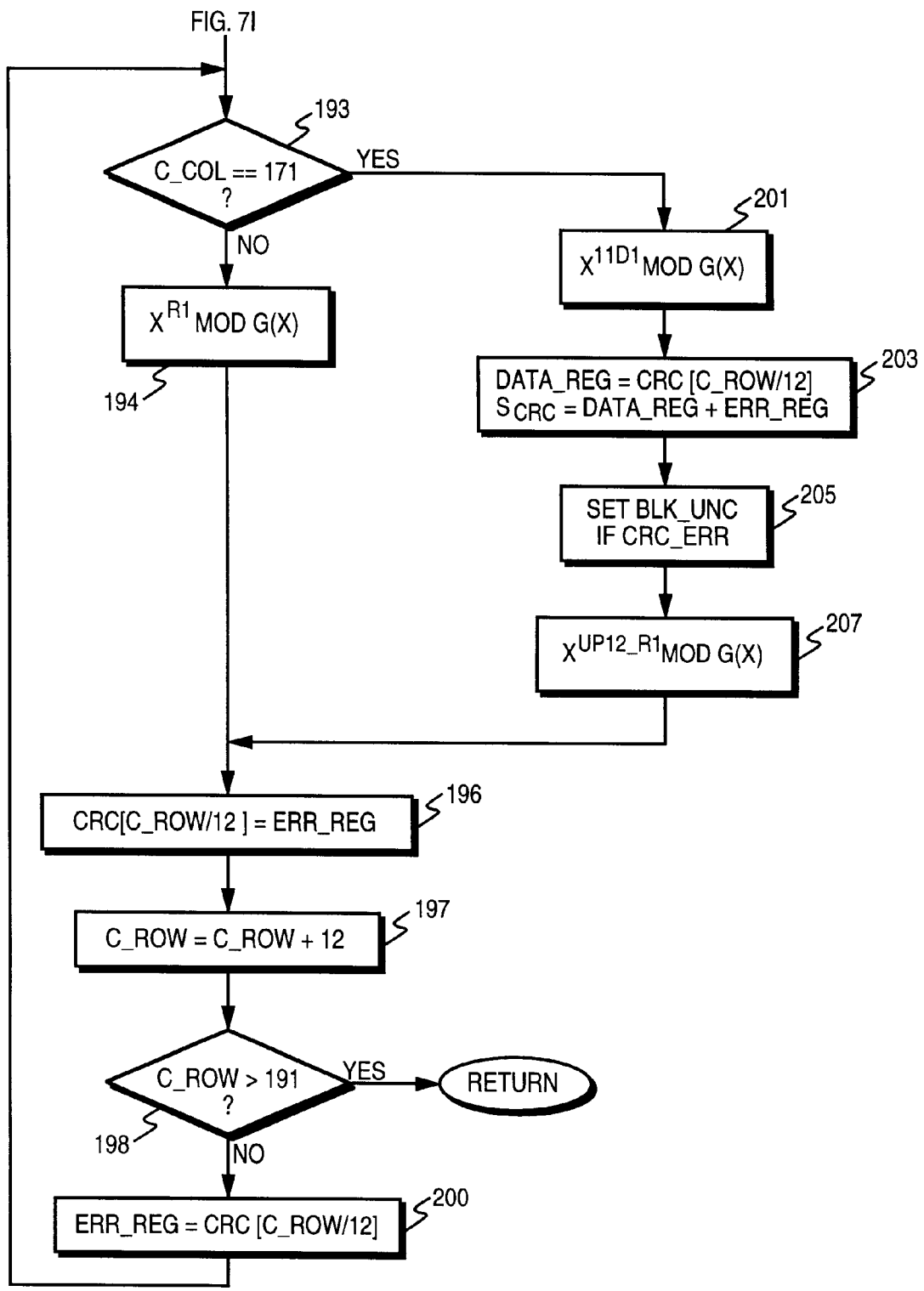

If at step 192 the codeword uncorrectable error flag (CW_UNC) has been set or if the ECC syndromes for the current vertical codeword are zero, then the flow diagram of FIG. 7J is executed to adjust the error CRC syndromes right by one symbol (i.e., the current vertical codeword is skipped). If at step 193 C_COL does not equal 171 (i.e., if not processing the last vertical codeword of the data sector), then at step 194 the error CRC syndrome for the first data sector is adjusted right by one symbol (one column). At step 196 the partial error CRC syndrome for the current data sector is stored to the SRAM 15, and at step 197 C_ROW is incremented by 12, that is, to the next data sector. If C_ROW is not greater than 191 at step 198, then at step 200 the ERR_REG is loaded from the SRAM 15 with the partial error CRC syndrome for the next data sector and at step 194 that error CRC syndrome is adjusted right by one symbol and restored to the SRAM 15 at step 196. This loop is re-iterated until C_ROW is greater than 191 at step 198, wherein all of the error CRC syndromes will have been adjusted right by one symbol (one column) to skip the current vertical codeword.

If at step 193 of FIG. 7J C_COL equals 171, then the last vertical codeword (before the ECC redundancy) is about to be skipped. Therefore, the final CRC syndrome for each data sector needs to be generated for each data sector, and the BLK_UNC flag set if errors still remain. At step 201, the error CRC syndrome for the current data sector (stored in ERR_REG) is adjusted down eleven data symbols (e.g., from symbol 148 to symbol 152 of FIG. 3B). Step 201 is actually implemented as a loop where the ERR_REG is adjusted down one symbol (D1) eleven times. Then at step 203, DATA_REG is initialized with the data CRC syndrome for the current data sector from the SRAM 15, and the final CRC syndrome is generated by combining the DATA_REG with the ERR_REG. If the final CRC syndrome does not equal the CRC over the pseudo random sequence, then at step 205 the block uncorrectable flag (BLK_UNC) is set. At step 207, the error CRC syndrome is adjusted to the beginning of the data sector by adjusting it up 12 rows and right one data symbol (e.g., from symbol 152 to symbol 160 of FIG. 3B). The error CRC syndrome for the next data sector is loaded into ERR_REG at step 200 and the above procedure is reiterated. When C_ROW is greater than 191 at step 198, then a CRC check will have been performed for each data sector and the error CRC syndromes repositioned to the beginning of each data sector.

Referring again to FIG. 7I, if at step 192 the codeword uncorrectable flag (CW_UNC) is not set and the ECC syndromes are not zero, then a branch is executed at step 206 to update the error CRC syndromes based on the value of the current correction row C_ROW. If C_ROW is 192–207 at step 206, then control simply returns since the ECC redundancy symbols are not included in the CRC codeword. If C_ROW is 0–191, then the current error CRC syndrome is adjusted down one symbol at step 208 and the correction value for the next symbol is added to the error CRC syndrome at step 210. The step 208 for adjusting the error CRC syndrome down one symbol is skipped if the error CRC syndrome is positioned to the first row of a data sector (i.e., if C_ROW mod 12 is zero at step 212).

If at step 209 the last row of the current data sector has been reached (i.e., C_ROW+1 mod 12 is zero), then the error CRC syndrome is adjusted to the top of the data sector for the next vertical codeword. This is carried out by adjusting the error CRC syndrome down one symbol (D1) at step 211, and then up twelve and right one symbol (UP12_R1) at step 213. If at step 215 C_COL equals 171, then the error CRC syndrome is positioned over the last symbol in the data sector and the CRC check is performed. At step 217 the DATA_REG is loaded from the SRAM 15 with the data CRC syndrome for the current data sector and combined with the ERR_REG to generate the final CRC syndrome. If the final CRC syndrome does not equal the CRC over the pseudo random sequence, then the block uncorrectable flag (BLK_UNC) is set at step 219. The error CRC syndrome is then moved up twelve rows and right one data symbol (UP12_R1) at step 213 to reposition it over the first symbol of the data sector (e.g., from symbol 152 to symbol 160 of FIG. 3B), and the error CRC syndrome for the current data sector (stored in ERR_REG) is restored to the SRAM 15 at step 214.

Figure 7K:
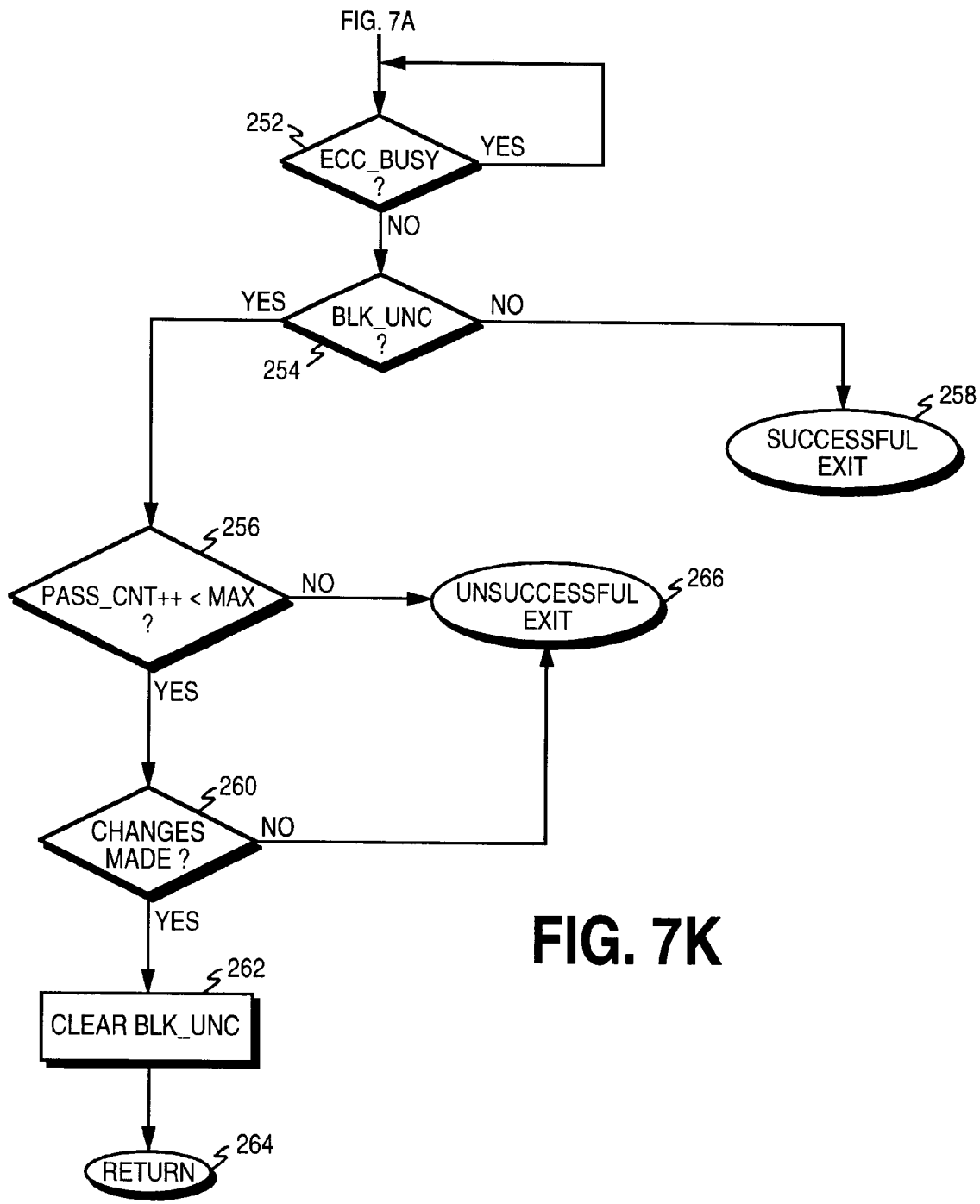
FIG. 7K is a flow diagram for combining the contents of the CRC data register and the CRC error register to generate a final CRC syndrome for checking the validity and completeness of the corrections at the end of a horizontal or vertical pass.

At the end of the vertical pass, the BLK_UNC flag is examined at step 254 of FIG. 7K to verify the validity and completeness of the corrections to the product code. If errors still remain, then another horizontal pass is performed. If the ECC syndromes for the horizontal codewords are stored in the SRAM 15, then the flow diagram of FIG. 7E is executed and the error CRC syndromes updated at steps 117 and 126. If the ECC syndromes for the horizontal codewords are not stored in the SRAM 15, then the flow diagram of FIG. 7C is executed and the error CRC syndromes updated at steps 71 and 81.

The flow diagram of FIG. 7K illustrates the steps executed to determine whether the product code has been completely corrected or if it is uncorrectable at the end of a horizontal or vertical pass.

At step 252, the system waits for the ECC_BUSY flag to clear before performing examining the BLK_UNC flag. If the block uncorrectable flag (BLK_UNC) is not set at step 254, indicating that an uncorrectable error was not encountered during the previous horizontal or vertical pass, then the correction procedure exits successfully at step 258 without making any additional passes as is required by the prior art.

If the BLK_UNC flag is set at step 254, then a pass count variable PASS_CNT is incremented at step 256, and if PASS_CNT exceeds a predetermined maximum, the product code is uncorrectable and the correction procedure exits unsuccessfully at step 266. If the PASS_CNT is less than the maximum at step 256, then if no changes were made at step 260 (no corrections made) during the previous horizontal and vertical passes, the correction procedure again exits unsuccessfully at step 266 since additional passes will be to no avail. Otherwise, the BLK_UNC flag is cleared at step 262 and the correction procedure continues at step 264 by executing another horizontal or vertical pass.

Because the CRC syndromes $S_{CRC}$ are computed concurrent with correcting the product code, the correction procedure may terminate successfully at the end of either a horizontal or vertical pass. Consequently, the present invention avoids the additional pass required by the prior art to determine whether the correction is complete. Furthermore, the present invention avoids the additional pass required by the prior art to derandomize the data and generate the CRC syndromes $S_{CRC}$ at the end of the correction process. Thus, the present invention provides a significant improvement over the prior art by significantly increasing the throughput of optical storage devices.

CRC Generator Circuitry

Figure 8:
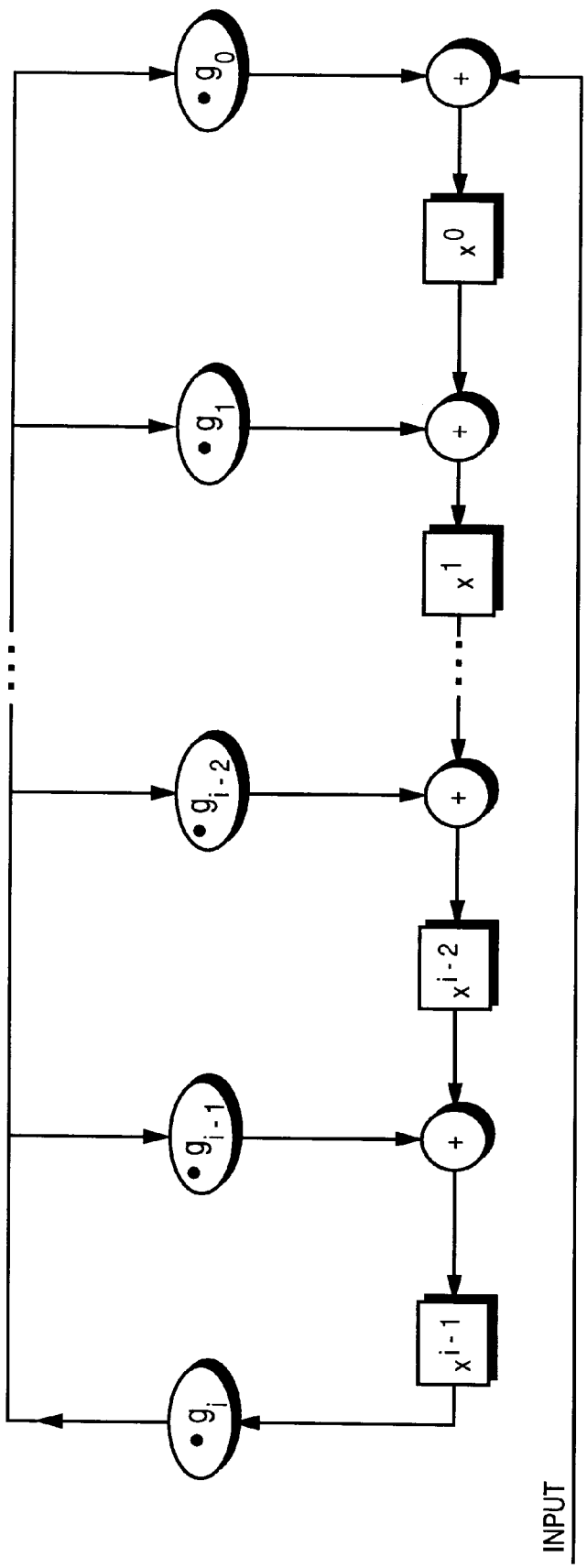
FIG. 8 is a conventional linear feedback shift register (LFSR) for use in generating the CRC redundancy during a write operation, and the CRC syndrome during a read operation.

The CRC generator and correction validator 19 of FIG. 2 generates the CRC redundancy symbols for the sixteen data sectors shown in FIG. 3A during a write operation, and it generates the CRC syndromes $S_{CRC}$ during a read operation for use in validating the corrections made by the error corrector 18 as described above with reference to FIG. 7A–7J. FIG. 8 shows a conventional linear feedback shift register (LSFR) for generating the CRC redundancy symbols during a write operation. Operation of the LFSR shown in FIG. 8 is well known—it divides an input polynomial D(x) by a generator polynomial G(x):

$$G(x) = g_i x^i + g_{i-1} x^{i-1} + \ldots + g_1 + g_0.$$

The coefficients of the input polynomial D(x) are shifted serially through the LFSR, where the number of shifts equals the degree of the input polynomial plus one. The remainder, or CRC redundancy, is the final state of the shift register. To generate the CRC redundancy for each data sector shown in FIG. 3A, the k bits of data are represented as the coefficients of a polynomial P(x). The CRC redundancy is then computed as:

$$\text{CRC redundancy} = P(x) \cdot x^{n-k} \bmod G(x),$$

where n−k is the number of CRC redundancy symbols and G(x) is the generator polynomial. The contents of the register after the final shift is the CRC redundancy, which is then appended to the user data to form a CRC codeword which is incorporated into the product code and then written to the disk.

During a read operation, the data read from the disk are processed to generate the CRC syndrome $S_{CRC}$ according to:

$$\text{CRC syndrome} \, S_{CRC} = C'(x) \bmod G(x),$$

where C'(x) is the CRC codeword (including the CRC redundancy) read from the disk. In the prior art, after the error corrector 14 finishes making corrections, the data is read from the data buffer 1 and derandomized by derandomizer 4. The derandomized data is then processed serially so that the same LFSR circuit of FIG. 8 can be used to generate the CRC syndrome $S_{CRC}$ according to the above equation.

In the present invention, the CRC syndrome $S_{CRC}$ is generated concurrent with correcting the product code as described above with reference to FIGS. 7A–7J. Therefore, the LFSR circuit of FIG. 8 cannot be used to generate the CRC syndrome $S_{CRC}$ because the data is not processed as a series of consecutive bits. An overview of the CRC syndrome generator of the present invention is provided before describing how it generates the CRC syndrome $S_{CRC}$.

Figure 9:
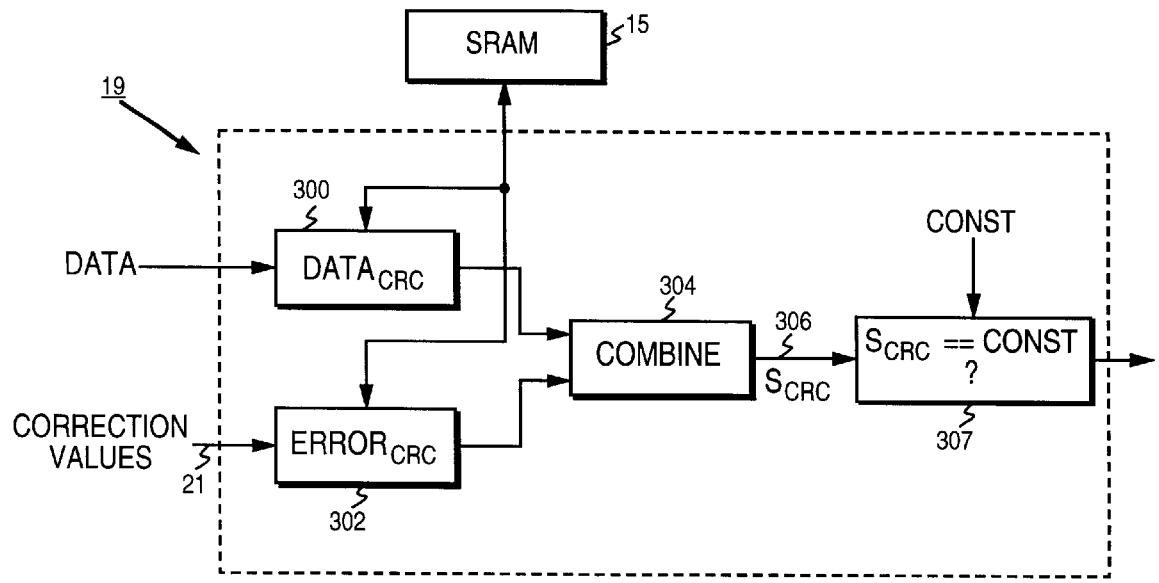
FIG. 9 is a block diagram of the CRC correction validation circuit comprising a $DATA_{CRC}$ circuit for computing the data part of the CRC syndrome, an $ERROR_{CRC}$ circuit for computing the error part of the CRC syndrome, and a circuit for combining the $DATA_{CRC}$ and $ERROR_{CRC}$ registers to generate the final CRC syndrome $S_{CRC}$ which is then compared to a constant equal to the CRC over the random data pattern.

FIG. 9 shows a block diagram of the CRC syndrome generator 19 of FIG. 2, which is comprised of a $DATA_{CRC}$ circuit 300 and an $ERROR_{CPC}$ circuit 302. As described above with reference to FIG. 7A, the $DATA_{CRC}$ is generated at step 37 during the first horizontal pass over the product code of FIG. 3A using the uncorrected, randomized data read from the data buffer 1 of FIG. 2. The $ERROR_{CRC}$ is generated using the correction values generated by the error corrector 18 during the iterative processing of the horizontal and vertical code words. When the end of a data sector is reached, the $DATA_{CRC}$ and the $ERROR_{CRC}$ are combined by COMBINE circuit 304 to generate a final CRC syndrome $S_{CRC}$ 306 which is compared to a constant at comparator 307 to determine whether the data sector still contains errors. The mathematical function performed by the COMBINE circuit 304 is a simple exclusive-or (XOR) of the $DATA_{CRC}$ and $ERROR_{CRC}$.

As described above, there are sixteen data sectors in the product code of FIG. 3A; accordingly, there are sixteen data and error CRC syndromes stored in the SRAM 15. The CRC check is performed for each data sector by reading the respective data and error CRC syndromes from the SRAM 15 and loading the syndromes into the $DATA_{CRC}$ 300 and $ERROR_{CRC}$ 302 circuits, respectively. The comparator 307 compares the final CRC syndrome $S_{CRC}$ to a constant equal to the CRC over the pseudo random data sequence used to randomize each data sector. Since the pseudo random data sequence is different for each block (product code), a corresponding CRC constant is loaded into the comparator 307 each time a new block is read from the storage medium.

Figure 10:
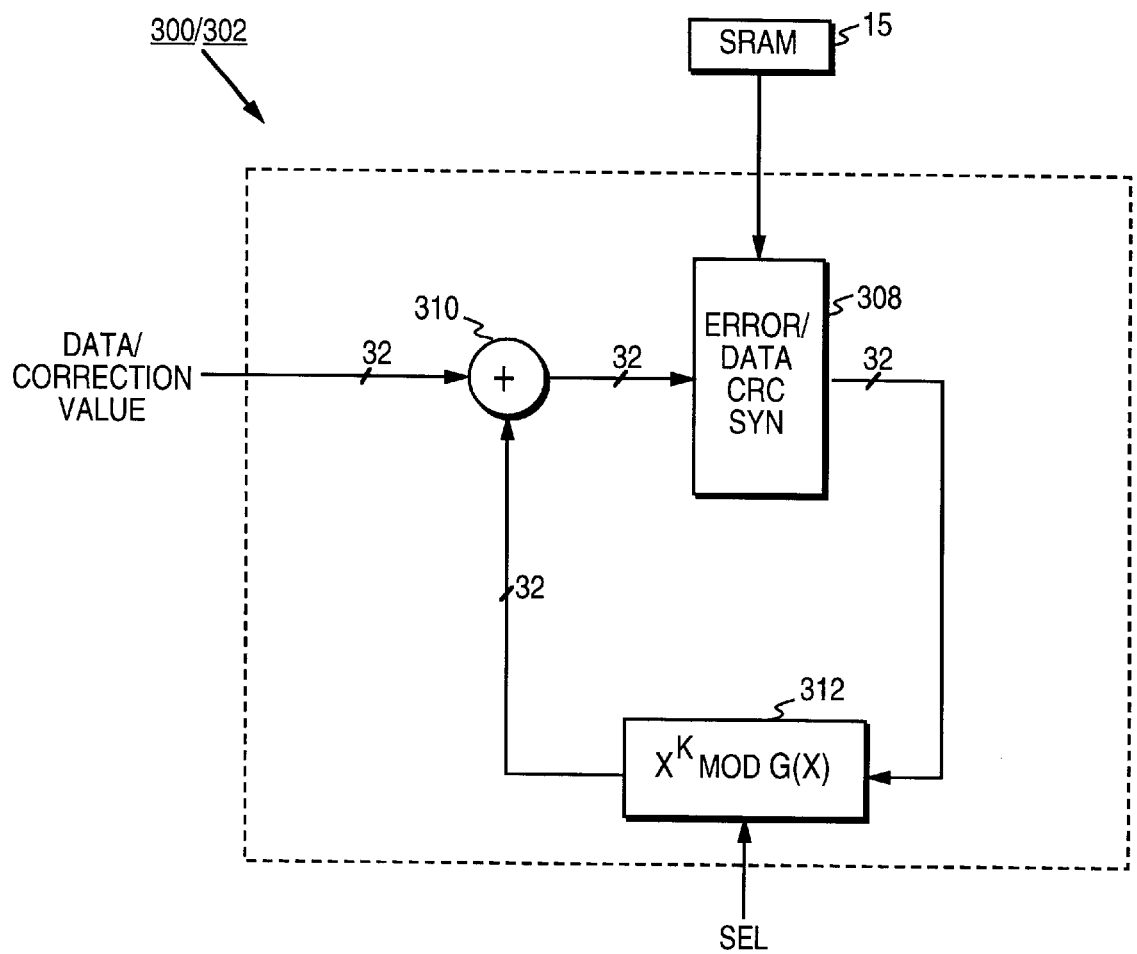
FIG. 10 is a detailed block diagram of the $DATA_{CRC}$/$ERROR_{CRC}$ circuits of FIG. 9.

A more detailed depiction of the $DATA_{CRC}$ 300 and the $ERROR_{CRC}$ 302 circuits of FIG. 9 is shown in FIG. 10. The $DATA_{CRC}$ 300 and the $ERROR_{CRC}$ 302 circuits of FIG. 9 generate the data and error CRC syndrome by representing the received CRC codeword polynomial C'(x) as the linear combination of a plurality of subset polynomials:

$$C'(X)=C_j(x)+C_{j-1}(x)+ \ldots +C_0(x),$$

where each subset polynomial $C_k(x)$ comprises a predetermined number of bits from the code word polynomial C'(x). In the embodiment disclosed herein, each subset polynomial comprises 8 bits of the code word polynomial C'(x), such that in hexadecimal representation:

$$
\begin{aligned}
C_0(x) &= 00000000 \ldots 0000000000xx + \\
C_1(x) &= 00000000 \ldots 00000000xx00 + \\
C_2(x) &= 00000000 \ldots 000000xx0000 + \\
&\ldots + \\
C_{j-1}(x) &= 00xx0000 \ldots 000000000000+
\end{aligned}
$$

-continued
$$
\begin{aligned}
C_j(x) &= xx000000 \ldots 000000000000= \\
\hline
C'(x) &= xxxxxxxx \ldots xxxxxxxxxxxx.
\end{aligned}
$$

In this manner, the CRC syndrome $S_{CRC}$ can be generated conceptually as the linear combination of the CRC syndrome for each subset polynomial:

CRC syndrome $S_{CRC}=C_0(x) \bmod G(x)+C_1(x) \bmod G(x)+ \ldots + C_j(x) \bmod G(x)$.

The above equation can be re-arranged into:

CRC syndrome $S_{CRC}=\overline{C}_0(x) \cdot x^{8 \cdot 0} \bmod G(x)+\overline{C}_1(x) \cdot x^{8 \cdot 1} \bmod G(x)+ \ldots +\overline{C}_j(x) \cdot x^{8 \cdot j} \bmod G(x)$.

where $\overline{C}_k(x)$ are the 8 bit polynomials out of the codeword C'(x) (i.e., $\overline{C}_k(x)=C_k(x) \cdot x^{-8k}$). Another mathematical relationship exploited by the present invention is:

$$\overline{C}_k(x) \cdot x^{n+m} \bmod G(x) = (\overline{C}_k(x) \cdot x \bmod G(x)) \cdot x^m \bmod G(x).$$

Referring again to FIG. 3B, using the above equations the data CRC syndrome is computed for the first symbol 160 of the first data sector during the first pass over the horizontal code words. The first symbol 160 comprise the most significant coefficients of the above codeword C'(x) as well as the non-zero coefficients of the above subset polynomial $C_j(x)$. The first symbol 160 is loaded into a 32 bit register 308 of FIG. 10 (after zero padding the most significant bits and adding zero at adder 310). Then when the next symbol 140 of the codeword in FIG. 3B is read, the content of the register 308 is multiplied by $x^K$ mod G(x) at multiplier 312 to shift the data CRC syndrome one symbol to the right (i.e., K=R1 at step 146 of FIG. 7F). The result of the multiplication is then reloaded into the register 308 (after adding the next symbol 140 of the codeword at adder 310 which starts the CRC syndrome computation for that particular subset polynomial). This computation is performed for the remaining symbols until the last symbol 148 of the first horizontal codeword of FIG. 3B has been read. The CRC syndrome is then adjusted to location 150 of FIG. 3B by multiplying the content of register 308 by $x^K$ mod G(x), where K equals right one symbol (i.e., K=R1 at step 146 of FIG. 7F described above). The appropriate value for the offset K is selected via a SEL control line for the multiplier 312 of FIG. 10.

This process continues until the last symbol of the last horizontal codeword of the first data sector of FIG. 3B has been read, wherein the register 308 contains the data CRC syndrome for the first symbol of the CRC codeword C'(x) (i.e., for the subset polynomial $C_j(x)$), added to the data CRC syndromes computed for the other symbols (i.e., the other subset polynomials), thereby generating the data CRC syndrome for the entire CRC codeword C'(x) of the first data sector. At this point, the data CRC syndrome for the first data sector is positioned to the last symbol 152 of FIG. 3B. When the flow diagram of FIG. 7F is executed again to process the first symbol 204 of the next data sector, the data CRC syndrome for the first data sector is stored into the SRAM 15 and the first symbol 204 of the next data sector is loaded into register 308 at step 138 of FIG. 7F. The above process repeats for the second and subsequent data sectors, where at the end of the first horizontal pass all sixteen data CRC syndromes are generated and stored in the SRAM 15.

The $ERROR_{CRC}$ circuit 302 of FIG. 9 for generating the error CRC also comprises the circuitry of FIG. 10. When a correction value is generated by the error corrector 18 of FIG. 2, the correction value is added into the register 308 at adder 310. The multiplier 312 continues to multiply the content of the registers 308 by the appropriate K offset as each symbol in a horizontal or vertical codeword is processed, regardless as to whether a correction value is generated (i.e., even if the correction value is zero). At the end of each data sector, the data and error CRC syndromes are combined to generate the final CRC syndromes $S_{CRC}$ for use in determining whether the corrections are valid and complete as described above.

Figure 11:
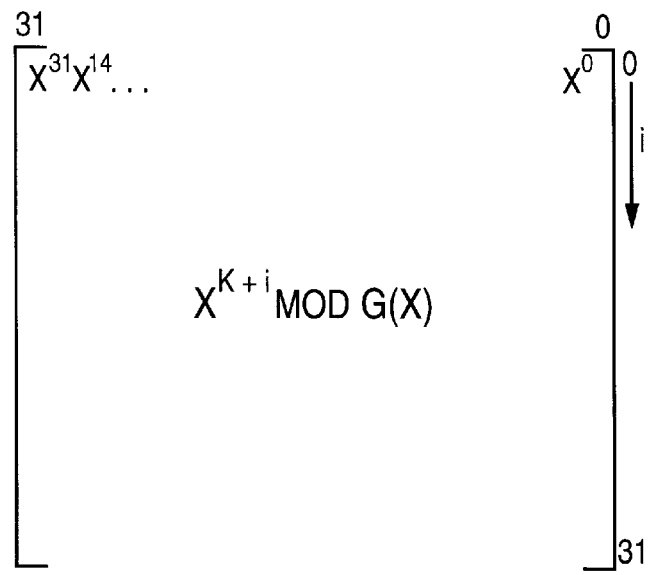
FIG. 11 shows the general form of a matrix for computing the multiplier $x^K$ MOD $G(x)$ shown in FIG. 11.

The preferred embodiment for implementing the $x^K$ mod $G(X)$ multiplier 312 of FIG. 10 is understood with reference to FIG. 11. FIG. 11 represents a table of remainders generated by the computation:

$$x^{K+i} \bmod G(x),$$

where i equals $\{0 \ldots 31\}$. The table of FIG. 11 is generated for each of the K offset values used during the computation of the CRC syndrome (i.e., R1, D1 and UP12_R1). The multiply operation is then carried out by multiplying the content of register 308 of FIG. 10 by the appropriate table (i.e., by multiplying a 32-bit vector by a 32×32 matrix).

The actual tables for implementing the $x^K$ mod $G(x)$ multiply for the 32-bit CRC generator $G(x)$ are shown in the VHDL source code of Appendix 1. The table labeled "constant r1_dvd_tbl" implements the shift right by one symbol (R1) adjustment, the table labeled "constant d1_dvd_tbl" implements the shift down one row (D1) adjustment, and the table labeled "constant u12r1_dvd_tbl" implements the shift up 12 and right one symbol (UP12$_R$1) adjustment.

The remainder of the VHDL source code in Appendix 1 carries out the actual multiply operation by multiplying the content of register 308 of FIG. 10 by the appropriate table (i.e., by multiplying a 32-bit vector by a 32×32 matrix). The product of the input register or vector and the matrix is an output vector, where each element in the output vector is generated by summing the products of the n elements of the ith row of the table (or matrix) with the corresponding components of the register (or column input vector). This sum can be written as:

$$y_i = \sum_{k=0}^{31} a_{ik} x_k$$

where $y_i$ is the output vector of the multiplier 312, $a^{ik}$ are the 32 bits of the ith row of the table of FIG. 11, and $x_k$ are the 32 bits stored in register 308 of FIG. 10. The output vector $y_i$ from the multiplier 312 is added to the input bits at adder 310, and the result is restored to the register 308.

SRAM

Figures 12A, 12B:
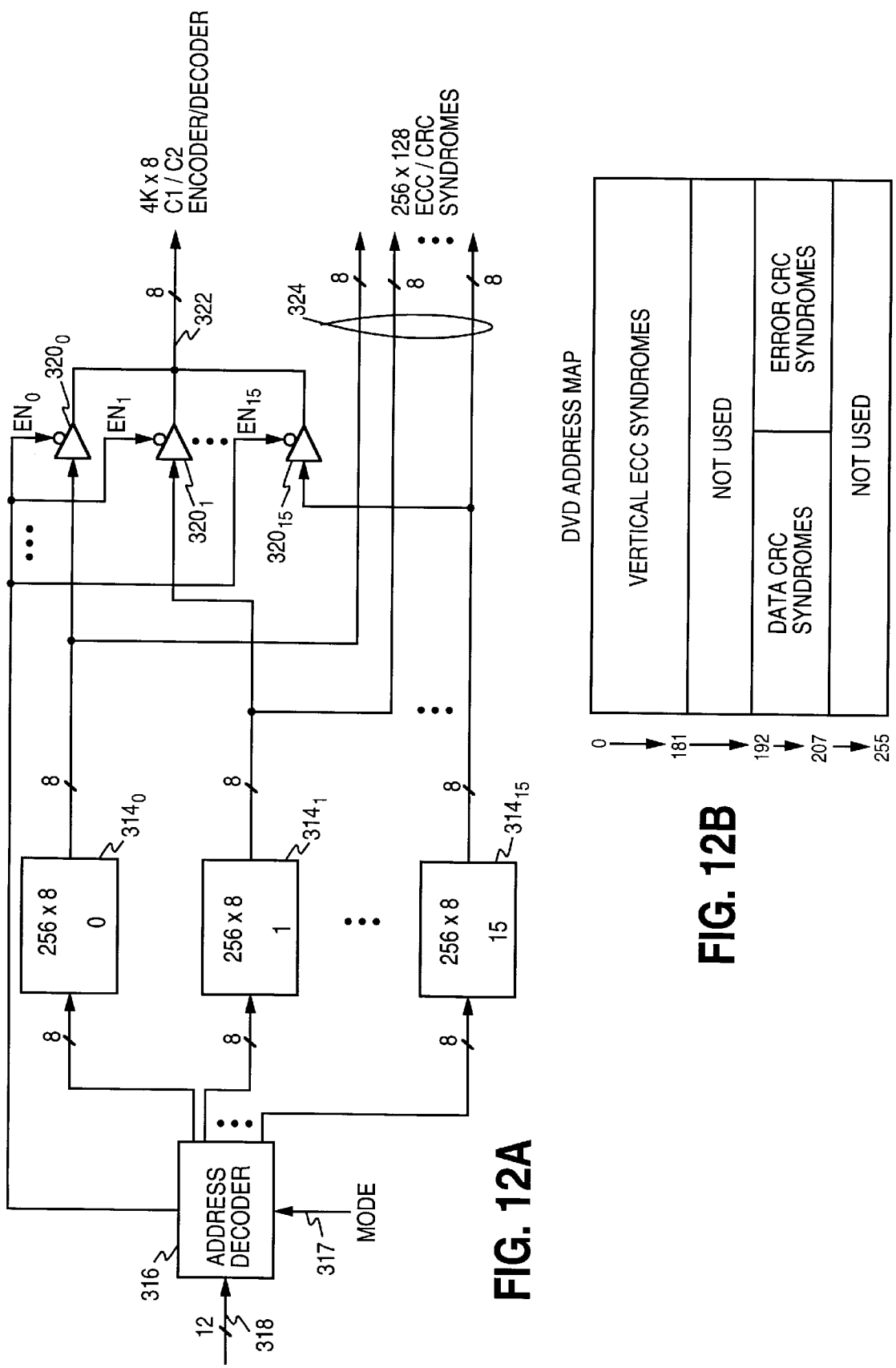
FIG. 12A illustrates the structure of the SRAM and how it is configured between decoding the C1/C2 code for CD format and for storing partial syndromes for the product code and CRC validation code for DVD format.
FIG. 12B shows the SRAM mapping of vertical ECC syndromes and CRC validation syndromes for the preferred embodiment of the present invention.

The structure and operation of the SRAM 15 of FIG. 2 is understood with reference to FIG. 12A. As described above, the SRAM 15 performs a dual function depending on the mode of operation: for CD mode, the SRAM 15 provides data buffering for the C1/C2 decoding, and for DVD mode, the SRAM 15 stores the ECC syndromes for the product code and the CRC syndromes for the CRC validation code. In the preferred embodiment for DVD mode, only the 182 vertical ECC syndromes of the product code shown in FIG. 3A are stored in the SRAM 15, together with the sixteen CRC syndromes corresponding to the 16 data sectors. The 208 horizontal ECC syndromes of the DVD product code are regenerated over each horizontal pass and not stored in the SRAM 15. Those skilled in the art will appreciate that this configuration is merely a particular embodiment and that the capacity of the SRAM 15 could be increased to store both the vertical and horizontal ECC syndromes as well as the CRC syndromes.

Referring to FIG. 12A, the SRAM 15 is preferably implemented as a bank of sixteen 256 by 8-bit memory cells $314_0$–$314_{15}$. Each memory cell comprises an 8-bit input address for accessing the 256 data bytes, and an 8-bit output bus for outputting the addressed data byte. An address decoder 316 decodes a 12-bit address 318 depending on the mode of operation as configured over control line 317. For CD mode, the bank of memory cells $314_0$–$314_{15}$ are addressed as a 4k by 8-bit buffer; that is, all twelve bits of address 318 are used to access a single 8-bit data byte for C1/C2 decoding. The first eight bits of address 318 are used to select the same data byte from each memory cell $314_0$–$314_{15}$. The outputs of the memory cells are wireored together through tri-state buffers $320_0$–$320_{15}$. The appropriate tri-state buffer is enabled using the remaining four bits of address 318, thereby asserting the appropriate data byte onto bus 322 for use in the C1/C2 decoding.

For DVD mode, the SRAM 15 is addressed as a 256 by 128 buffer; that is, only the first eight bits of address 318 are used to select the same data byte from each memory cell $314_0$–$314_{15}$. The sixteen data bytes output from each memory cell are combined 324 to form either the sixteen ECC syndromes of a vertical codeword as shown in FIG. 5 and FIG. 6B, or to form the four bytes of a CRC syndrome for a data sector shown in FIG. 3A.

The preferred mapping for the vertical ECC syndromes and the CRC syndromes in DVD mode is shown in FIG. 12B. The first 182 addresses are used to store the sixteen ECC syndromes of the 182 vertical codewords. The next ten addresses are skipped, and addresses 192–207 are used to store the sixteen 4-byte data and error CRC syndromes for the sixteen data sectors of the DVD product code of FIG. 3A. Using addresses 192–207 to access the data and error CRC syndromes simplifies the decode circuitry since only the three least significant bits of the address change. The rest of the SRAM 15 is not used for the DVD mode.

The objects of the invention have been fully realized through the embodiments disclosed herein. Those skilled in the art will appreciate that the various aspects of the invention can be achieved through different embodiments without departing from the essential function. For example, the product code shown in FIG. 3A is typically employed in digital video disks (DVDs), but the present invention is equally applicable to other product code formats, including the format used in compact disks (CDs). Furthermore, the present invention could be applied to other multi-dimensional codes, not just product codes. Thus, the particular embodiments disclosed are illustrative and not meant to limit the scope of the invention as appropriately construed by the following claims.

I claim:

1. An error correction processor for correcting errors in binary data read from a disk storage medium, wherein the binary data comprises a plurality of intersecting ECC codewords of a multi-dimensional codeword, the multi-dimensional codeword comprising ECC redundancy symbols, validation redundancy symbols, and a plurality of data sectors, the error correction processor comprising:

(a) a data buffer for storing the ECC codewords read from the disk storage medium;

(b) a syndrome buffer for storing a plurality of intermediate values for use in generating a validation syndrome for each data sector;

(c) an ECC decoder for generating error syndromes in response to an ECC codeword stored in the data buffer, the error syndromes for correcting errors in the ECC codeword; and (d) an error correction validator for generating the validation syndromes in response to the validation redundancy symbols, the validation syndromes for verifying corrections made to the ECC codeword by the ECC decoder.

2. The error correction processor as recited in claim 1, wherein:

(a) the multi-dimensional codeword comprises a first and second set of intersecting ECC codewords; and (b) the ECC decoder corrects errors in the binary data by processing, in sequential passes, the first set of ECC codewords and the second set of ECC codewords.

3. The error correction processor as recited in claim 2, wherein:

(a) the error correction validator generates a data validation syndrome for each of the data sectors during a first pass over the first set ECC codewords;

(b) the data validation syndromes are stored in the syndrome buffer;

(c) the error correction validator generates an error validation syndrome for each data sector using correction values generated by the ECC decoder for correcting the ECC codewords during passes over the first and second set ECC codewords;

(d) the error validation syndromes are stored in the syndrome buffer; and (e) the error correction validator combines the data validation syndrome with the corresponding error validation syndrome stored in the syndrome buffer to generate a final validation syndrome compared to a predetermined value.

4. The error correction processor as recited in claim 3, wherein:

(a) the validation redundancy symbols are generated according to a generator polynomial of a finite field; and (b) the predetermined value is based on the generator polynomial.

5. The error correction processor as recited in claim 1, wherein:

(a) the error correction validator generates a partial validation syndrome for each of the data sectors concurrent with the ECC decoder processing the ECC codewords; and (b) the error correction validator comprises an offset controller for adjusting a current partial validation syndrome according to a location of a particular codeword symbol being processed by the ECC decoder.

6. The error correction processor as recited in claim 5, wherein when the ECC decoder generates a correction value for correcting a data symbol of one of the data sectors:

(a) the offset controller adjusts the corresponding partial validation syndrome according to the location of the data symbol being corrected; and (b) the error correction validator updates the partial validation syndrome using the correction value.

7. The error correction processor as recited in claim 5, wherein:

(a) each of the data sectors comprises validation redundancy symbols;

(b) the validation redundancy symbols for each data sector are generated according to a generator polynomial $G(x)$ of a finite field; and (c) the offset controller adjusts the partial validation syndrome of a data sector by multiplying the partial validation syndrome by $$X^K \bmod G(x)$$

where K is an offset value and the mod operator performs modulo division.

8. The error correction processor as recited in claim 1, wherein the validation redundancy symbols are generated according to a cyclic redundancy code (CRC).

9. An error correction processor for correcting errors in binary data read from a disk storage medium, wherein the binary data comprises a plurality of intersecting ECC codewords of a multi-dimensional codeword, the multi-dimensional codeword comprising ECC redundancy symbols, validation redundancy symbols, and a plurality of data sectors, the error correction processor comprising:

(a) a data buffer for storing the ECC codewords read from the disk storage medium;

(b) a syndrome buffer for storing a plurality of intermediate values for use in generating validation syndromes for each data sector;

(c) an ECC decoder for generating error syndromes in response to an ECC codeword stored in the data buffer, the error syndromes for correcting errors in the ECC codeword; and (d) an error correction validator for generating the validation syndromes in response to the validation redundancy symbols, the validation syndromes for verifying corrections made to the ECC codeword by the ECC decoder, the error correction validator comprising:

(i) a data validation register connected to receive one of a plurality of data validation values stored in the syndrome buffer corresponding to the plurality of data sectors;

(ii) an error validation register connected to receive one of a plurality of error validation values stored in the syndrome buffer corresponding to the plurality of data sectors;

(iii) a validation syndrome generator for combining a data validation value with a corresponding error validation value to generate one of the validation syndromes; and (iv) a comparator for comparing the validation syndrome to a predetermined value to determine if the errors made by the ECC decoder are valid and complete.

10. The error correction processor as recited in claim 9, wherein:

(a) the multi-dimensional codeword comprises horizontal ECC codewords and vertical ECC codewords; and (b) the ECC decoder corrects errors in the binary data by processing, in sequential passes, the horizontal ECC codewords and the vertical ECC codewords.

11. The error correction processor as recited in claim 10, wherein:

(a) the error correction validator generates the data validation value for each of the data sectors during a first pass over the horizontal codewords; and (b) the error correction validator generates the error validation values for each of the data sectors using correction values generated by the ECC decoder for correcting the ECC codewords during passes over the horizontal and vertical ECC codewords.

12. The error correction processor as recited in claim 10, wherein:
   (a) a vertical codeword comprises data symbols in at least two of the data sectors;
   (b) the error correction validator loads the data validation register with the data validation value stored in the syndrome buffer corresponding to the appropriate data sector as the ECC decoder processes the vertical codeword; and
   (c) the error correction validator loads the error validation register with the error validation value stored in the syndrome buffer corresponding to the appropriate data sector as the ECC decoder processes the vertical codeword.

13. The error correction processor as recited in claim 9, wherein:
   (a) the validation redundancy symbols are generated according to a generator polynomial of a finite field; and
   (b) the predetermined value is based on the generator polynomial.

14. The error correction processor as recited in claim 9, wherein:
   (a) the error correction validator updates the data validation values and the error validation values stored in the syndrome buffer for each of the data sectors concurrent with the ECC decoder processing the ECC codewords; and
   (b) the error correction validator comprises an offset controller for adjusting a current data validation value or error validation value according to a location of a particular codeword symbol being processed by the ECC decoder.

15. The error correction processor as recited in claim 14, wherein when the ECC decoder generates a correction value for correcting a data symbol of one of the data sectors:
   (a) the offset controller adjusts the corresponding error validation value according to the location of the data symbol being corrected; and
   (b) the error correction validator updates the error validation value using the correction value.

16. The error correction processor as recited in claim 14, wherein:
   (a) each of the data sectors comprises validation redundancy symbols;
   (b) the validation redundancy symbols for each data sector are generated according to a generator polynomial $G(x)$ of a finite field; and
   (c) the offset controller adjusts the data validation value or error validation value of a data sector by multiplying the data validation value or error validation value by $$X^K \mod G(x)$$

where K is an offset value and the mod operator performs modulo division.

17. The error correction processor as recited in claim 9, wherein the validation redundancy symbols are generated according to a cyclic redundancy code (CRC).

18. A method for correcting errors in binary data read from a disk storage medium, wherein the binary data comprises a plurality of intersecting ECC codewords of a multi-dimensional codeword, the multi-dimensional codeword comprising ECC redundancy symbols, validation redundancy symbols, and a plurality of data sectors, the method comprising the steps of:
   (a) storing, in a data buffer, the ECC codewords read from the disk storage medium;
   (b) storing, in a syndrome buffer, a plurality of intermediate values for use in generating a validation syndrome for each data sector;
   (c) generating error syndromes in response to an ECC codeword stored in the data buffer, the error syndromes for correcting errors in the ECC codeword; and
   (d) generating the validation syndromes in response to the validation redundancy symbols, the validation syndromes for verifying corrections made to the ECC codeword by the ECC decoder.

* * * * *